(12) United States Patent
Sharma

(10) Patent No.: US 8,606,215 B2
(45) Date of Patent: Dec. 10, 2013

(54) METHODS AND SYSTEMS FOR INTERFERENCE REJECTION FOR LOW SIGNALS

(75) Inventor: Arun Kumar Sharma, Cupertino, CA (US)

(73) Assignee: SecureALL Corporation, Mountain View, CA (US)

( * ) Notice: Subject to any disclaimer, the term of this patent is extended or adjusted under 35 U.S.C. 154(b) by 0 days.

(21) Appl. No.: 13/358,894

(22) Filed: Jan. 26, 2012

(65) Prior Publication Data

US 2012/0171978 A1 Jul. 5, 2012

Related U.S. Application Data

(63) Continuation of application No. PCT/US2011/067960, filed on Dec. 29, 2011.

(60) Provisional application No. 61/428,134, filed on Dec. 29, 2010.

(51) Int. Cl.
*H04B 1/16* (2006.01)
*H04K 3/00* (2006.01)

(52) U.S. Cl.
USPC .................. 455/343.2; 455/296; 455/324

(58) Field of Classification Search
USPC .................... 455/343.1–343.4, 574
See application file for complete search history.

(56) References Cited

U.S. PATENT DOCUMENTS

| | | | |
|---|---|---|---|
| 4,200,871 A | 4/1980 | Roeder et al. | |
| 6,873,703 B1 | 3/2005 | Enriquez | |
| 6,950,642 B2 | 9/2005 | Karr | |
| 7,019,617 B2 | 3/2006 | Pratt et al. | |
| 7,106,246 B1 | 9/2006 | Lindell | |
| 7,142,838 B2 | 11/2006 | Rotzol | |
| 7,199,634 B2 | 4/2007 | Cho et al. | |
| 7,650,135 B2 * | 1/2010 | Twitchell | 455/343.3 |
| 8,059,628 B2 | 11/2011 | Bradley et al. | |
| 8,180,291 B2 * | 5/2012 | Burr | 455/41.2 |
| 2003/0119568 A1 | 6/2003 | Menard | |
| 2004/0174271 A1 | 9/2004 | Welles et al. | |
| 2004/0259544 A1 | 12/2004 | Amos | |
| 2005/0063348 A1 | 3/2005 | Donovan | |
| 2005/0215274 A1 | 9/2005 | Matson et al. | |
| 2006/0008085 A1 | 1/2006 | Matsuo | |

(Continued)

OTHER PUBLICATIONS

PCT International Search Report and Written Opinion mailed Feb. 19, 2010, Application No. PCT/US2009/050180, 16 pages.

(Continued)

*Primary Examiner* — Lee Nguyen
(74) *Attorney, Agent, or Firm* — Haynes and Boone LLP

(57) ABSTRACT

A radio device and a method to operate a non-heterodyne receiver are provided. The radio device is configured to receive a signal waveform and to provide a wake-up signal to a second communication circuit when the signal waveform is a valid communication request; wherein the second communication circuit switches from a power saving state to an operating state upon receiving the wake-up signal from the non-heterodyne receiver. The non-heterodyne receiver further including an Electromagnetic interference (EMI) rejection circuit, including a narrow band filter and a broadband filter to reject an EMI signal. A filter circuit for a narrow passband circuit is also provided. The filter including a buffer circuit; a crystal oscillator coupled to the output of the buffer circuit; and an inverting amplifier coupled in parallel to the crystal oscillator.

20 Claims, 28 Drawing Sheets

(56) References Cited

U.S. PATENT DOCUMENTS

| | | |
|---|---|---|
| 2006/0030373 A1 | 2/2006 | Park |
| 2006/0100000 A1 | 5/2006 | Marples et al. |
| 2006/0222118 A1 | 10/2006 | Murthy et al. |
| 2007/0149257 A1 | 6/2007 | Cheresh |
| 2007/0183449 A1 | 8/2007 | Beagley et al. |
| 2008/0048779 A1 | 2/2008 | Crawley et al. |
| 2008/0084836 A1 | 4/2008 | Baird et al. |
| 2008/0303601 A1 | 12/2008 | Young |
| 2009/0110035 A1 | 4/2009 | Sutton et al. |
| 2009/0238308 A1 | 9/2009 | Weiner et al. |
| 2010/0040120 A1 | 2/2010 | Sharma |

OTHER PUBLICATIONS

Long, John "SiGe Radio Frequency ICs for Low-Power Portable Communication,," Proceedings of the IEEE, vol. 93, No. 9, Sep. 2005, 26 pages.

International Search Report issued in International Application No. PCT/US2011/067960; filed Dec. 29, 2011, mailing date Sep. 3, 2012.

Written Opinion issued in International Application No. PCT/US2011/067960; filed Dec. 29, 2011, mailing date Sep. 3, 2012.

Liapine, A., Resonant Cavities as Beam Position Monitors, Part 3. Analog Signal Processing. Accelerator Physicist, *Department of Physics, University of London, UK*; 6 pages, received Apr. 10, 2012, web: http://www.hep.ucl.ac.uk/~liapine.

Barry, John R., et al., "Carrier Synchronization for Homodyne and Heterodyne Detection of Optical Quadriphase—Shift Keying," *Department of EECS, University of California*, Jul. 2, 1992, 36 pages.

Mirabbasi, Shahriar, et al., "Classical and Modern Receiver Architectures," *IEEE Communications Magazine*, Nov. 2000, 8 pages.

Supplemental Notice of Allowance dated Mar. 29, 2013 of related U.S. Appl. No. 12/500,587, filed Jul. 9, 2009, 7 pages.

\* cited by examiner

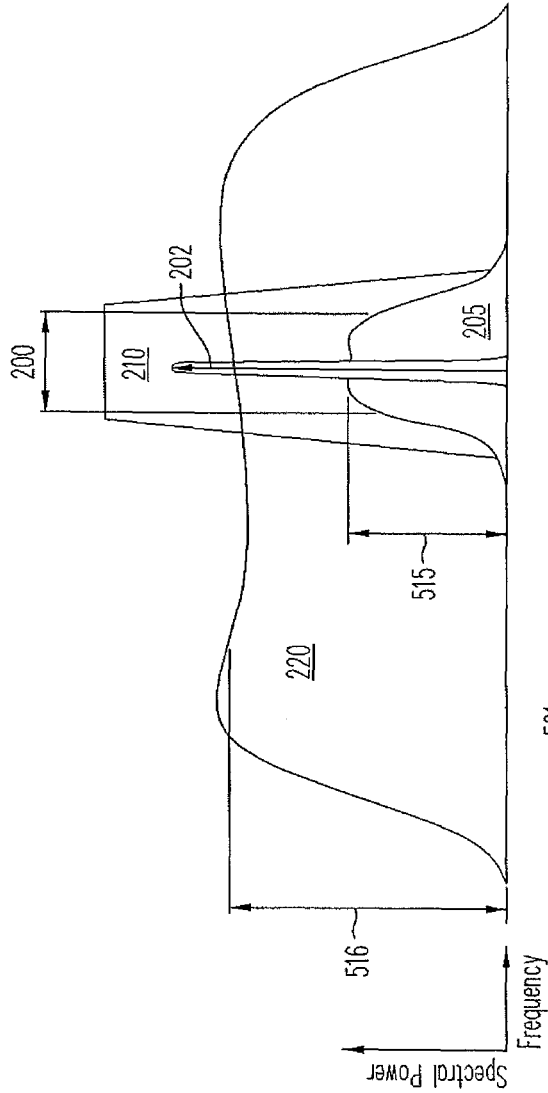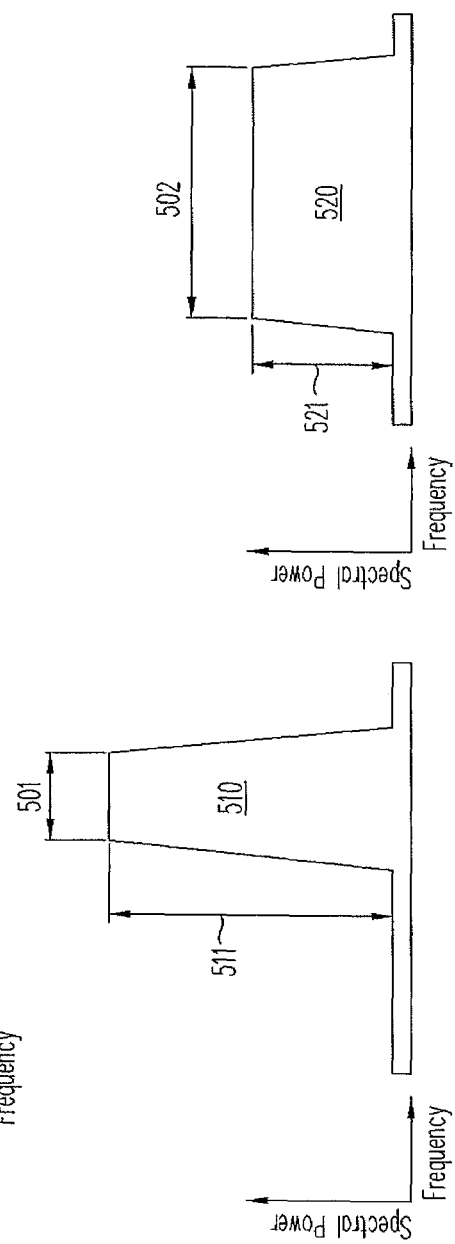

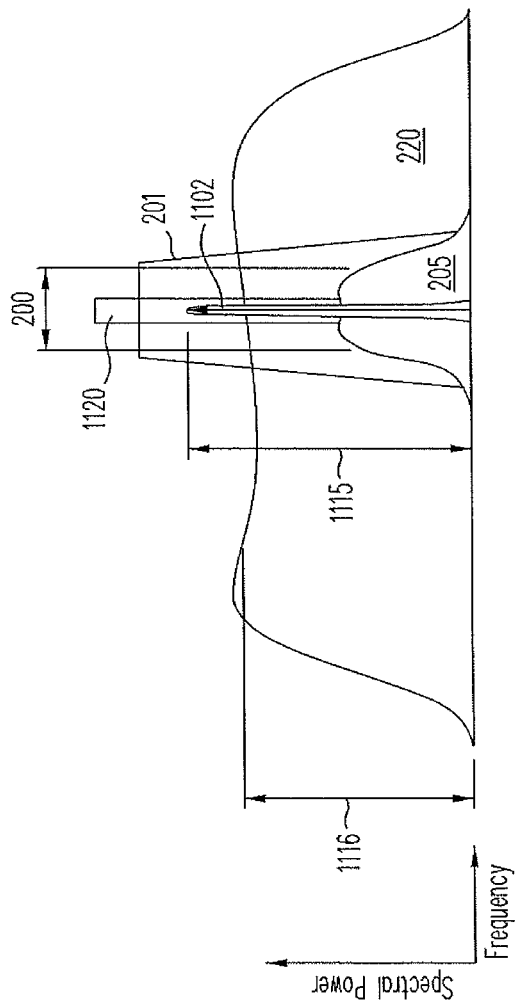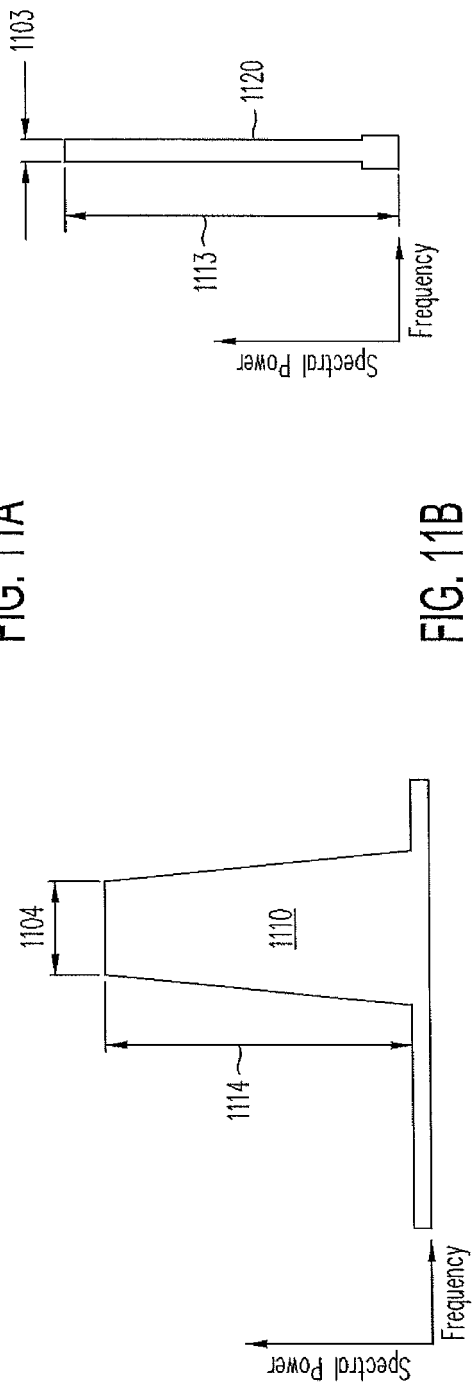
FIG. 11A
FIG. 11B

METHODS AND SYSTEMS FOR INTERFERENCE REJECTION FOR LOW SIGNALS

CROSS-REFERENCE TO RELATED APPLICATIONS

This application is a continuation application of and claims priority to PCT application No. PCT/U.S.2011/067960 filed Dec. 29, 2011, designating the United States of America, the contents of which are incorporated by reference, as if fully stated here, for all purposes, and which claims priority to U.S. Provisional Patent Application No. 61/428,134 filed Dec. 29, 2010, the contents of which are incorporated by reference, as if fully stated here, for all purposes.

BACKGROUND

1. Field of the Disclosure

Embodiments described herein relate to the field of wireless communication devices and systems. More particularly, embodiments described herein relate to the field of signal processing and electromagnetic interference (EMI) rejection for wireless communications devices and systems.

2. Description of Related Art

In the context of the present disclosure, a wireless device is understood as a device having a wireless communication capability. The device may be mobile or fixed to a station. In the field of wireless communications, wireless devices are used to receive and transmit a signal to and from another wireless device. Signals in the electro-magnetic radio-frequency (RF) spectral domain are used for wireless communications, ranging in frequency from a few MHz (Mega-Hertz) up to hundreds of GHz (Giga-Hertz). Use of the license free Industrial, scientific and medical (ISM) spectral band, shared among various types of wireless devices, is attractive for many low power wireless applications. Thus, electromagnetic interference (EMI) between different wireless devices becomes an issue for signal processing. Furthermore, many consumer electronic products such as liquid crystal displays (LCDs), flat screen panels, WiFi routers, Bluetooth devices, microwave ovens, and others use circuitry operating at these frequencies, therefore emitting radiation causing electro-magnetic interference (EMI) to a wireless device used for communication.

State-of-the-art approaches for removing EMI include sophisticated transceivers to ensure device functionality in the presence of other devices in the vicinity. Unrelated devices in the vicinity of a transceiver may be operating on a nearby channel, or even on the same channel as the transceiver, in an asynchronous, time shared mode. Sophisticated transceivers impose a significant energy load on battery powered devices. Some techniques for EMI rejection use transceivers having heterodyne receivers and sophisticated modulation/demodulation techniques such as digital signal processing (DSP). Some embodiments use spread-spectrum techniques such as frequency hopping and/or DSSS, typically expensive to implement and which use high battery power. Intensive use of battery power is especially burdensome for mobile wireless devices, seriously impairing operating life from a specified battery capacity.

What is needed is a device and a method for using a device providing good rejection of EMI without imposing significant power consumption.

SUMMARY

A radio device according to embodiments disclosed herein may include a non-heterodyne receiver, configured to receive a signal waveform and to provide a wake-up signal to a second communication circuit when the signal waveform is a valid communication request; wherein the second communication circuit switches from a power saving state to an operating state upon receiving the wake-up signal from the non-heterodyne receiver. The non-heterodyne receiver further including an Electromagnetic interference (EMI) rejection circuit including a narrow band filter and a broadband filter to reject an EMI signal.

A filter circuit for a narrow passband circuit according to embodiments disclosed herein may include a buffer circuit; a crystal oscillator coupled to the output of the buffer circuit; and an inverting amplifier coupled in parallel to the crystal oscillator.

In some embodiments, a method to operate a radio device may include turning 'on' a first receiver for a period of time; receiving a signal waveform in the first receiver; detecting a first signal level from the signal waveform using a narrow band filter; detecting a second signal level from the signal waveform using a broad band filter; comparing the first signal level and the second signal level to determine if the signal waveform is a valid communication request or an electromagnetic interference (EMI); when the signal waveform is a valid communication request, turning 'on' a second circuit; when the signal waveform is EMI, maintaining the second circuit in a sleep mode; turning 'off' the first receiver after the period of time lapses.

These and other embodiments of the present disclosure will be described in further detail below with reference to the following drawings.

BRIEF DESCRIPTION OF THE DRAWINGS

FIG. 5A illustrates a partial view of a spectrum of an EMI and a signal, overlapping the operation parameters of a receiver according to embodiments disclosed herein.

FIG. 5B illustrates a partial view of the operation parameters of a receiver, according to embodiments disclosed herein.

FIG. 11A illustrates a partial view of a spectrum of an interference and a signal, overlapping the operation parameters of a receiver according to embodiments disclosed herein.

FIG. 11B illustrates a partial view of the operation parameters of a receiver, according to embodiments disclosed herein.

In the figures, elements having the same reference number have the same or similar functions.

DETAILED DESCRIPTION

Figure 1:
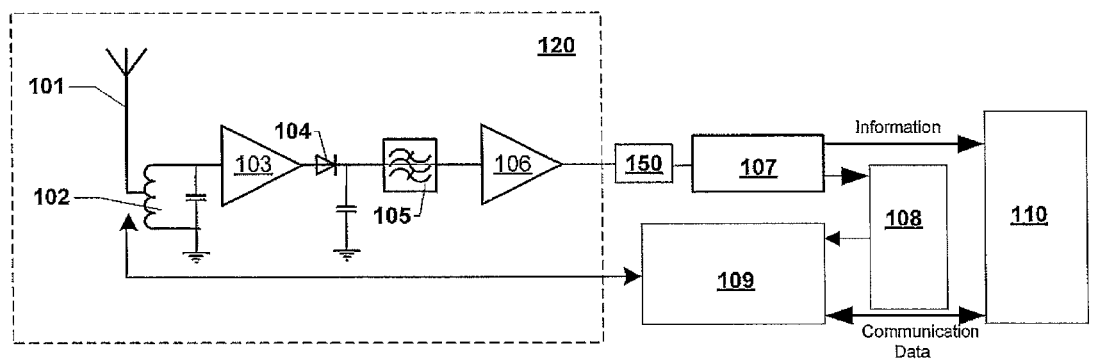
FIG. 1 illustrates a partial block diagram of a radio device, according to embodiments disclosed herein.

Wireless devices as disclosed herein may be a cell phone or a palm device having internet connectivity. In some embodiments, a wireless device as disclosed herein may be a hands-free key carried by a user in order to have access to doors in buildings and vehicles. Some embodiments may include a lower energy version of a Bluetooth connection. Some embodiments also include a proximity sensing device to produce a signal when a user goes away from a computer, or operator station. Embodiments disclosed herein are intended to provide EMI rejection for wireless devices performing RF communication with a desired partner. A desired partner may be another wireless device or transceiver, mobile or in a fixed location, generating a signal compatible with a wireless device as disclosed herein. Thus, a desired partner generates a valid communication request to communicate with the wireless device. Some embodiments incorporate simple amplitude modulation (AM, or some other narrow band modulation) schemes in the ISM band. This approach is combined with simple circuitry and algorithms to improve the receiver selectivity, according to embodiments disclosed herein. Thus, embodiments in the present disclosure overcome interference from other ISM band devices that may use spread spectrum techniques.

A wireless device using an AM receiver consistent with embodiments disclosed herein may receive a weak beacon signal from a partner as part of its data communication protocol. The weak beacon signal is susceptible to electromagnetic interference (EMI) from nearby wireless devices operating in the same band or channel. This is particularly true for EMI sources operating at a high duty cycle and/or high power level, such as Bluetooth appliances and LCD displays, among many others. To overcome EMI interference, a device consistent with the present disclosure may use a low power AM receiver to first detect a partner's beacon broadcast. Then, a device as disclosed herein may perform bidirectional data communication with the partner in a second stage, turning 'on' secondary electronics. A bidirectional data communication in embodiments as disclosed herein may consume greater battery energy. Secondary electronics may include a demodulator or a more sophisticated communication channel, including digital signal processing (DSP) circuits and techniques.

Methods, devices and systems to circumvent EMI from common narrow band interferers may be found in U.S. patent application Ser. No. 12/500,587, by Arun Kumar Sharma, entitled "Low Power Radio Communication System," filed on Jul. 9, 2009, the contents of which are herein incorporated by reference in their entirety, for all purposes (the '587 application). In the '587 application, sub-carrier modulation and base band modulation are used to provide a mechanism to distinguish a valid communication request from an unrelated wireless device. Thus, interference from narrow band interferers not using the same subcarrier modulation may be suppressed. Embodiments disclosed herein include broadband EMI generated from most popular ISM devices. In a wireless receiver as in the '587 application this broadband EMI may appear as noise. Embodiments consistent with the present disclosure further reject this type of broadband interference by taking advantage of its different spectral characteristics, compared to a beacon signal from a desired partner.

EMI from unrelated wireless devices using an ISM band generate interference that could significantly increase false positives in a receiver. False positives are also referred to as "Type-1" errors. Type-1 errors unnecessarily prompt a wireless device to power up secondary electronics, wasting battery power. Type-1 errors tend to be problematic for narrow band RF devices operating near wideband or spread spectrum communication appliances.

Embodiments consistent with the present disclosure reduce Type-1 errors generated by EMI by determining if a received signal is a beacon signal from a desired partner, or if the received signal is EMI. Some embodiments use the narrow band of beacon signals from desired partners to reject broadband EMI, mitigating Type-1 errors. For example, some embodiments compare the spectral energy density of a filter matched to the desired signal with the spectral energy density of a filter matched to the EMI spectrum. By varying the bandwidth ratio between the desired signal and a wideband channel around it, higher immunity against Type-1 errors from EMI interferers may be achieved. Thus, battery energy may be preserved, enabling the coexistence of multiple wireless devices operating on the same band (e.g. the ISM band).

In some embodiments disclosed herein, further performance improvement is obtained by using common electronic gain block hardware for data communication, as well as energy management functions.

According to embodiments disclosed herein, a radio receiver includes a two tiered system to conserve battery life. In a Tier-1 portion a low power AM receiver is always 'on', to detect an RF signal. When there is a high probability that the RF signal is from a compatible communication partner, secondary electronics in a Tier-2 portion of the receiver is turned 'on' to communicate with the partner. This communication consumes much more energy than the AM receiver. In some embodiments, a Tier-2 communication process involves digital signal protocols and heterodyne detection. Thus, it is desirable that the secondary electronics in the Tier-2 portion not be woken up by interfering signals. This will be described in detail in relation to FIG. 1, below. In some embodiments a Tier-1 portion may be turned 'on' periodically, for a period of time, at a pre-selected duty cycle, to search for beacon signals carrying a valid communication request.

FIG. 1 illustrates a partial block diagram of a radio device, according to embodiments disclosed herein. FIG. 1 shows a radio 100 in which a low-power, non-heterodyne receiver 120 is used in embodiments consistent with the present disclosure. Radio 100 also includes an EMI rejection circuit 150. Non-heterodyne receiver 120 and EMI rejection circuit 150 are included in a Tier-1 portion of the receiver circuit in radio 100. As shown in FIG. 1, a radio signal is received by non-heterodyne receiver 120 through antenna 101 and tuned by channel-tuning element 102 including, for example, discrete or distributed tuning elements. The tuned signal is optionally amplified by low-noise, RF amplifier 103 and demodulated by diode-detector based, RF-demodulator 104. Diode detector 104 can be selected from a Schottky diode, a tunnel diode, a back diode, or a metal-insulator-metal (MIM) diode, or a transistor. In some embodiments, demodulator 104 may be an RF detector or a frequency discriminator. Non-heterodyne receiver 120 may include a filter 105 and an amplifier 106. The signal passes to EMI rejection circuit 150, which may also include a filter as 105 and an amplifier 106, in some embodiments. The demodulated signal from RF demodulator 104 is filtered by filter 105 to reduce noise, and amplified by amplifier 106. In some embodiments, filter 105 may be included within amplifier 106. In some embodiments filter 105 may be a bandpass filter. The demodulated and filtered signal is a base-band signal processed in decoder 107.

Decoder 107 recovers the encoded information and determines if the signal is a valid wakeup signal from a partner radio apparatus. Decoder 107 may include logic to determine what circuits of radio 100 should be turned 'on' once a qualifying signal is detected. Decoder 107 may include one or more of the following: an energy detector; an amplitude detector; a frequency or phase detector; a digital data slicer; and a pseudo-noise (PN) correlator.

In embodiments consistent with the present disclosure, radio system 100 may include communication controller 108, and Tier-2 transceiver 109. Controller 108 coordinates electronic circuits in order to perform the communication protocol employed. In some embodiments, controller 108 is a digital circuit coordinating DSP protocols. With an efficient data modulation scheme more bits can be transmitted per symbol period, with or without the use of error correction techniques. The shorter Tier-1 broadcast can reduce transmitter battery load. According to some embodiments, transceiver 109 may include heterodyne receivers and transmitters. Transceiver 109 processes digital communication with a selected partner, after being turned 'on' by Tier-1 portion in radio 100.

Central processing unit (CPU) 110 is a computing element that provides overall control, according to some embodiments. Embodiments such as depicted in FIG. 1 are low power radio devices that use a two-tiered communication protocol. Thus, a low-power, Tier-1 portion of radio 100 determines if the received signal involves a valid communication request from a desired partner. When the Tier-1 portion determines that a communication should be established, a Tier-2 transceiver using more power is turned 'on'. In embodiments of radio communication system consistent with the present disclosure, CPU 110 may include a Microcomputer Unit (MCU) and an Analog-to-Digital Converter (ADC) circuit. CPU 110 may control the operation of controller 108, decoder 107, and transceiver 109.

According to some embodiments disclosed herein, CPU 110 may be implemented by a custom integrated circuit, or in one or more programmable logic circuits. Suitable programmable logic circuits may include, for example, field-programmable gate arrays (FPGAs) or complex programmable logical devices (CPLDs). In a custom integrated circuit implementation, CPU 110 may be provided as an application specific integrated circuit (ASIC).

In one embodiment, a sufficiently strong output signal detected by RF demodulator 104 may be used as a binary signal representing a request sent by a communication partner to initiate asynchronous communication. Upon detecting the signal, Tier-2 (or higher) transceiver 109 may be activated to communicate with the partner. Activation includes taking Tier-2 transceiver 109 from a power-saving state (e.g., a "deep-sleep," "sleep," or "hibernate" state) to a power 'on' or normal operational state.

According to some embodiments, a radio communication system may include a first radio device 100, having a first communication circuit comprising a non-heterodyne receiver 120, configured to receive a communication request and to provide a wake-up signal upon receiving the communication request. Radio device 100 may include a second communication circuit comprising a receiver, a transmitter, or a transceiver 109. Transceiver 109 may have an operating state and a power saving state, the second communication circuit switches from a power saving state (sleep mode) to an operating state, upon receipt of the wake-up signal from non-heterodyne receiver 120. The second communication circuit determines that the communication request is directed to the first radio communication device, and is broadcasted by a desired partner.

According to embodiments consistent with the present disclosure EMI rejection circuit 150 performs discrimination. This ensures that the communication request is from a valid communication partner. EMI rejection circuit 150 rejects any signal from an unrelated communication device. Embodiments consistent with the present disclosure operate a higher gain circuit, or activate a preselected demodulator upon detecting the communication request provided by non-heterodyne receiver 120. Although FIG. 1 shows EMI rejection circuit 150 coupled to the output of non-heterodyne receiver 120, some embodiments may have an EMI rejection circuit totally or partially included in non-heterodyne receiver 120.

According to embodiments consistent with the present disclosure the RF spectrum of signals received by radio device 100 is used by EMI rejection circuit 150 to eliminate interference signals from true communication signals. The operation parameters of a radio device 100 and a signal spectrum received by a radio device 100 in some embodiments are shown in detail in FIGS. 2A-2F. In FIGS. 2A-2F, the abscissa coordinate represents a frequency, and the ordinate represents a spectral power.

Figure 2A:
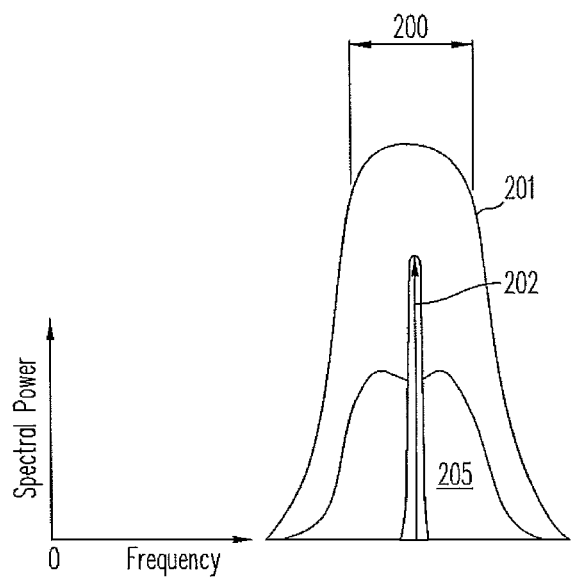
FIG. 2A illustrates a partial view of the spectrum of a signal, according to embodiments disclosed herein.

FIG. 2A illustrates a partial view of the spectrum of a signal, according to embodiments disclosed herein. FIG. 2A illustrates receiver band-pass filter 201 having bandwidth 200, centered on a beacon signal 202. Also included in FIG. 2A is the spectrum of a data portion 205 of a signal, having bandwidth 200, and centered around beacon signal 202. (Not limited to it being centered).

According to some embodiments, beacon signal 202 and data portion 205 are a valid communication signal from a desired partner to a radio device such as radio device 100, corresponding to a signaling waveform. In some embodiments, a signaling waveform may be a sub-carrier modulated (I.e. modulation of sub-carrier), or a base-band modulated (I.e. modulation of carrier). An operational parameter of a receiver in a radio device according to embodiments herein may include a sub-carrier frequency (fsc) that serves as beacon signal 202. According to some embodiments, fsc is the frequency of the demodulated signal at the output of RF demodulator 104 (cf. FIG. 1). In embodiments that use base band signaling, the signaling waveform has a tone beacon signal 202; such waveform may optionally further use digital data waveform 205 such as Manchester coding to minimize/suppress DC bias. Thus, according to some embodiments, receiver bandwidth 200 allows detection of data portion 205 while suppressing out of band, undesired extraneous interference and noise.

For example, in some embodiments a carrier signal may operate at approximately 1000 MHz with tone modulation at approximately 200 kHz. In some embodiments, beacon signal 202 may be provided by a sub-carrier modulation, fsc, itself.

In some embodiments using sub-carrier modulation, beacon signal 202 may be provided by modulating the sub-carrier with a specific tone. In embodiments having a carrier frequency of about 1000 MHz, fsc may operate at approximately 200 kHz. And the tone may operate at 20 KHz. In such embodiments then, beacon signal 202 will form two peaks separated by 20 kHz from fsc.

It should be noted that the spectrum of beacon signal 202 may be narrow, but because the beacon duration is short it is slightly broad and centered at the tone frequency. In some embodiments, beacon signal 202 may be a narrow band signal, compared to the bandwidth of data portion 205.

Figure 2B:
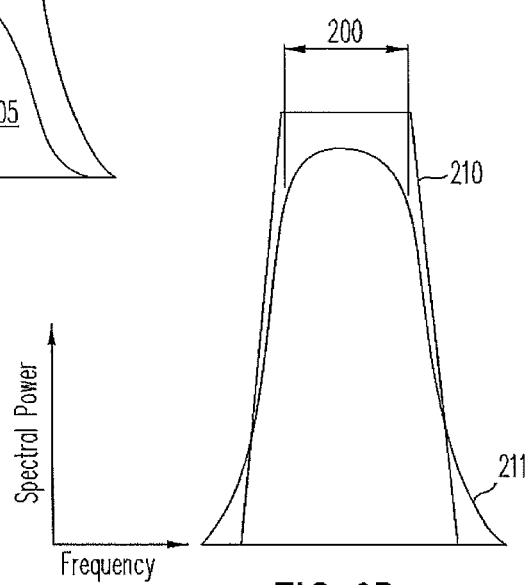
FIG. 2B illustrates a partial view of the operation parameters of a receiver, according to embodiments disclosed herein.

FIG. 2B illustrates a partial view of the operation parameters of a receiver, according to embodiments disclosed herein. FIG. 2B shows a schematic approximation 210 of band pass filter 201. Filter 210 may be represented as a trapezoid on the spectrum power versus frequency graph.

Figure 2C:
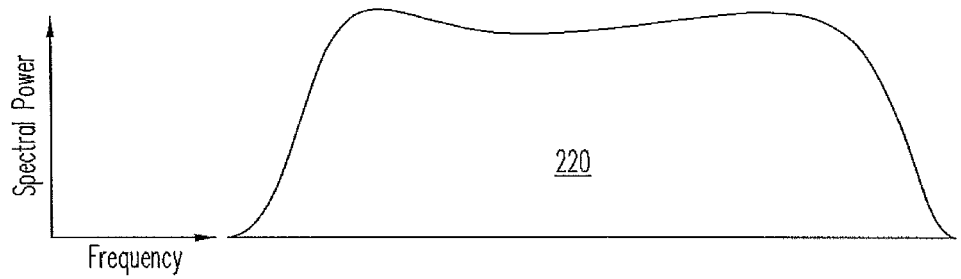
FIG. 2C illustrates a partial view of a spectrum of an EMI, according to embodiments disclosed herein.

FIG. 2C illustrates a partial view of a spectrum of an EMI 220, according to embodiments disclosed herein. Spectrum 220 may be the RF spectrum of a wireless device using spread spectrum techniques. Some examples of wireless devices using such type of wireless signals may include an 802.11 WiFi access point transmitting at 1 Watt RF power.

Figure 2D:
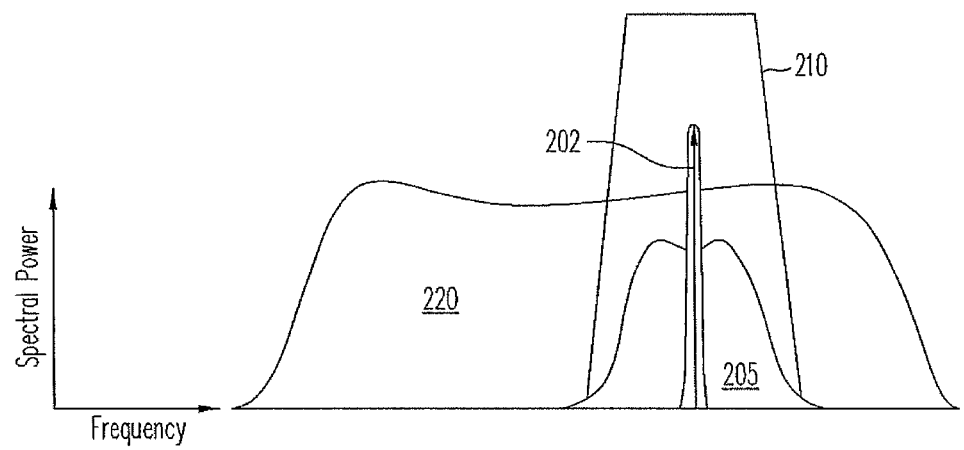
FIG. 2D illustrates a partial view of a spectrum of an EMI and a signal, overlapping the operation parameters of a receiver according to embodiments disclosed herein.

FIG. 2D illustrates a partial view of the spectrum 220 of an EMI and signal 205, overlapping the operation parameters of a receiver, according to embodiments disclosed herein. FIG. 2D shows the interference caused by a nearby foreign spread spectrum device (the interferer) to signal 205 as they overlap filter 210.

Figure 2E:
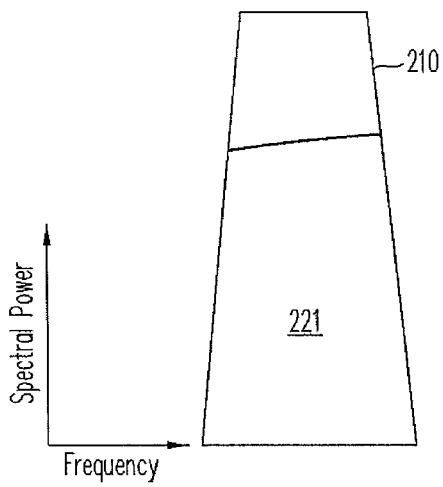
FIG. 2E illustrates a partial view of a spectrum of an EMI overlapping the operation parameters of a receiver, according to embodiments disclosed herein.

FIG. 2E illustrates a partial view of the spectrum 220 of an EMI overlapping the operation parameters of a receiver, according to embodiments disclosed herein. FIG. 2E shows an interference signal 221 received by a radio device having a filter 210, when there is no signal from a partner. A portion 221 of interference spectrum 220 overlapping filter 210 may be detected by a radio device according to embodiments disclosed herein.

Figure 2F:
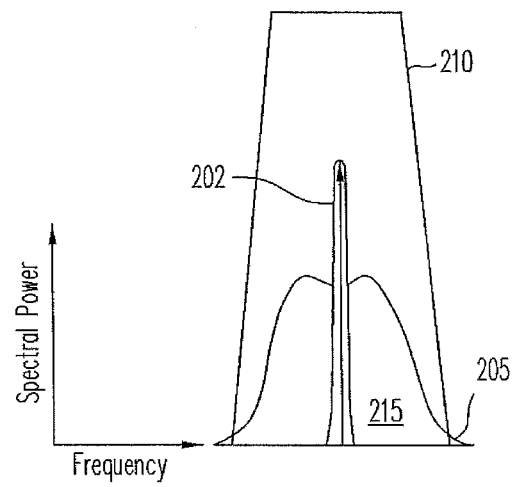
FIG. 2F illustrates a partial view of a spectrum of a signal overlapping the operation parameters of a receiver, according to embodiments disclosed herein.

FIG. 2F illustrates a partial view of the spectrum 205 of a data portion from a signal overlapping the operation parameters of a receiver, according to embodiments disclosed herein. In FIG. 2F a portion 215 of signal 205 overlapping filter 210 is detected by a radio device according to embodiments disclosed herein. Signal 205 may be transmitted by a compatible communication partner. According to embodiments consistent with the present disclosure, interference signal 221 is recognized as incompatible with a true communication partner so it is rejected. This process reduces electrical power consumption in a radio device such as radio device 100 (cf. FIG. 1). In some embodiments, this is performed by an EMI rejection circuit such as circuit 150 in Tier-1 portion of radio device 100. The EMI rejection circuit maintains the Tier-2 portion of the device in sleep mode.

Figure 3:
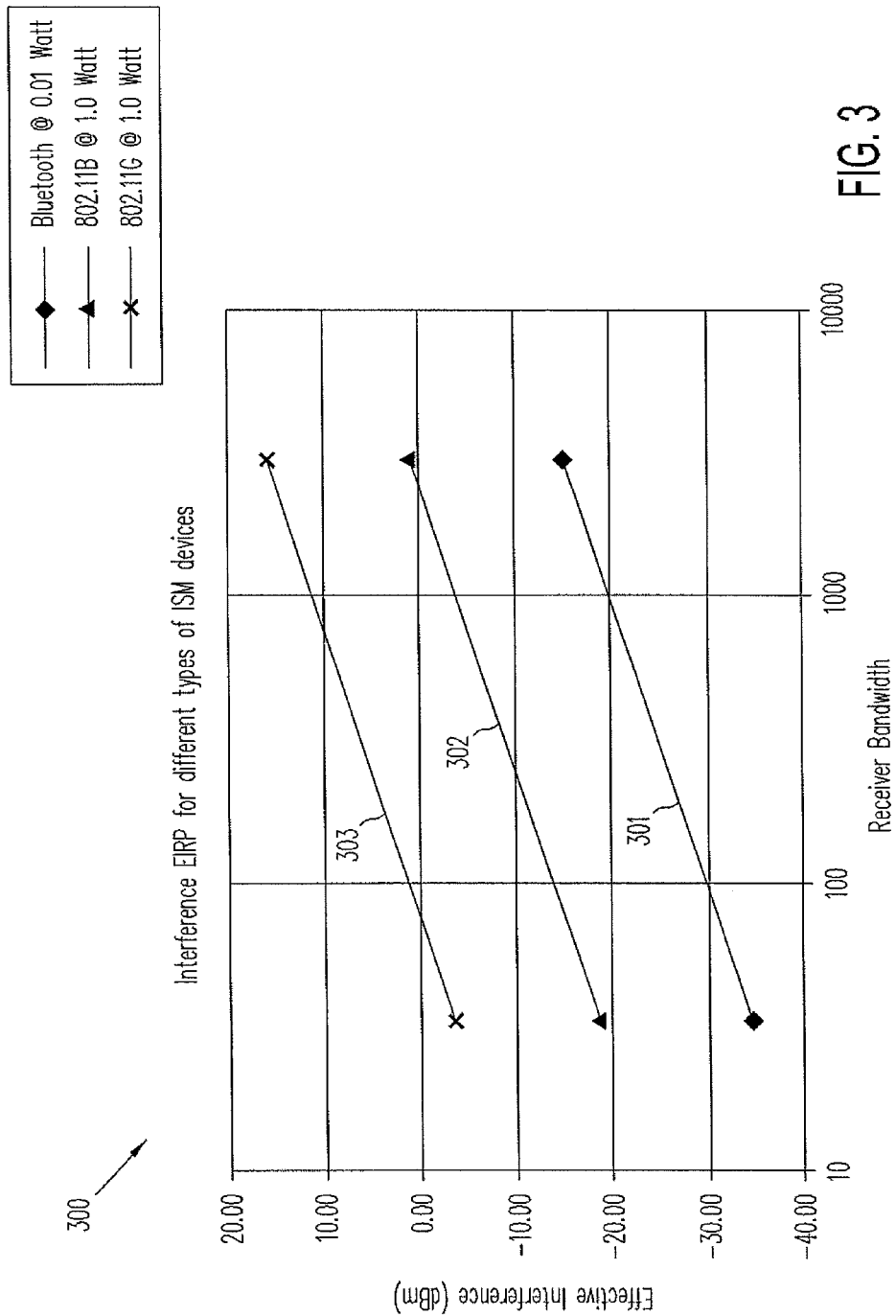
FIG. 3 illustrates a partial view of Effective Isotropically Radiated Power (EIRP) for wireless devices, according to embodiments disclosed herein.

FIG. 3 illustrates a partial view of Effective Isotropically Radiated Power (EIRP) 300 for wireless devices 301, 302, and 303, according to embodiments disclosed herein. The EIRP 300 graph gives an approximate idea of the level of interference that a radio device such as device 100 (cf. FIG. 1) may encounter in the presence of certain wireless appliances using ISM frequency bands. The abscissa in FIG. 3 represents a receiver bandwidth (in Hz), such as bandwidth 200 (cf. FIG. 2A). The ordinate in FIG. 3 is a logarithmic representation of the power of the radiation (in dBm) emitted by these appliances, received by a radio device such as device 100 (cf. FIG. 1). For example, in some embodiments EIRP 300 may correspond to the area of interfering signal 221 (cf. FIG. 2E).

Curve 301 shows the EIRP 300 of a Bluetooth device emitting at 10 mWatt power level. Curve 302 shows the EIRP 300 of an 802.11 B WiFi access point (AP) emitting at 1 W power level. Curve 303 shows the EIRP 300 of an 802.11G WiFi AP emitting at 1 W power level.

In embodiments consistent with the present disclosure, a partner of a radio device such as device 100 (cf. FIG. 1) may use 1 mWatt (0 dBm) of transmitted power. Thus, in the vicinity of a Bluetooth using 10 mWatt (curve 301), 802.11B WiFi AP (curve 302), and 802.11G WiFi AP using up to 1 Watt, the EIRP may be even larger than the signal, in some embodiments.

For example, a radio device 100 may have a bandwidth 200 (cf. FIG. 2A) of about 3 kHz. In such case, FIG. 3 shows that EIRP due to Bluetooth is relatively modest at about −15 dBm power. For an 802.11B WiFi AP the EIRP is about +1 dBm, larger than a 0 dBm power from a true communication partner for radio device 100. For a 802.11G WiFi AP, the EIRP at 3 kHz bandwidth reaches +16 dBm. Such an EIRP is 38 times higher than the 1 mW (0 dBm) used by the communication partner for radio device 100.

Continuing with the description of FIG. 3, in embodiments where a radio device 100 uses a receiver bandwidth 200 that is 33 Hz (about 100 times smaller than 3 KHz) the value of EIRP from every appliance is substantially reduced. For example, according to FIG. 3, the EIRP received by radio device 100 due to Bluetooth at about −35 dBm is negligible, compared to a partner providing a 0 dBm signal. For an 802.11B WiFi AP, the EIRP is relatively modest at about −19 dBm power. That is about 100 times lower than the 0 dBm used by the communication partner for radio device 100. In this configuration (bandwidth 200 ~33 Hz) the EIRP due to an 802.11G WiFi AP may be highly suppressed at about −4 dBm. That is less than ½ of the 0 dBm used by our low power communication device.

Table 1 below summarizes the above results, as illustrated in FIG. 3.

increasing the signal to noise (S/N) ratio. In some embodiments, it may be desirable to broaden somewhat the bandwidth of filter 405a in order to increase communication channel capacity. A relevant operational parameter for a filter is the 'Q' factor. The Q factor of a filter centered at frequency fq with a bandwidth Bw is defined as Q=fq/Bw. Thus, a narrow bandpass filter has a higher Q value than a broad bandpass filter centered at the same frequency.

Sharp, 'notch' (i.e. high "Q" factor) filters have a time domain response that is approximately the reciprocal of bandwidth (Bw), i.e. 1/Bw. Thus, sharp notch filters with small bandwidth are slow. Embodiments that broaden somewhat the bandwidth of sharp notch filters may use a beacon signal 202 for a shorter time, thus increasing the battery lifetime. For a balance between effective interference suppression and fast response time, a notch filter with typical Q value of 300 to

TABLE I

EIRP FOR THREE DIFFERENT WIRELESS APPLIANCESS (CF. FIG. 3)

|  | Bluetooth | | 802.11G | | 802.11B | |
| --- | --- | --- | --- | --- | --- | --- |
| Full Spectrum Bandwidth (Hz) | 1.00E+06 | 1.00E+06 | 5.00E+06 | 5.00E+06 | 5.00E+06 | 5.00E+06 |
| Sub Carrier Bandwidth (Hz) | 1.00E+06 | 1.00E+06 | 312,500 | 312,500 | 5.00E+06 | 5.00E+06 |
| Power (dBm) | 10.0 | 10.0 | 30.0 | 30.0 | 30.0 | 30.0 |
| Power (W) | 0.010 | 0.010 | 1.000 | 1.000 | 1.000 | 1.000 |
| Power density (W/Hz) | 1.00E−08 | 1.00E−08 | 2.00E−07 | 2.00E−07 | 2.00E−07 | 2.00E−07 |
| AM Power Density (W/Hz) | 1.00E−08 | 1.00E−08 | 3.20E−06 | 3.20E−06 | 2.00E−07 | 2.00E−07 |
| AM Power Envelop Bias Multiplier | 1.0 | 1.0 | 4.0 | 4.0 | 2.0 | 2.0 |
| Low power receiver bandwidth (Hz) | 33 | 3000 | 33 | 3000 | 33 | 3000 |
| Effective Interference power (Watt) | 0.0000003 | 0.0000300 | 0.0004224 | 0.0384000 | 0.0000132 | 0.0012000 |
| Effective Interference power (dBm) | −34.8 | −15.2 | −3.7 | 15.8 | −18.8 | 0.79 |

Embodiments as disclosed herein use the wideband nature of EMI from spread spectrum devices. On the contrary, typical beacon signals such as beacon signal 202 (cf. FIG. 2A) used for radio devices such as device 100 are narrowband. In embodiments consistent with the present disclosure an EMI rejection circuit such as circuit 150 resolves whether a received signal in device 100 is narrowband or broadband. If the signal is narrowband, it most likely corresponds to a desired partner, if the signal is broadband, it may be EMI from an unrelated wireless appliance.

Figure 4:
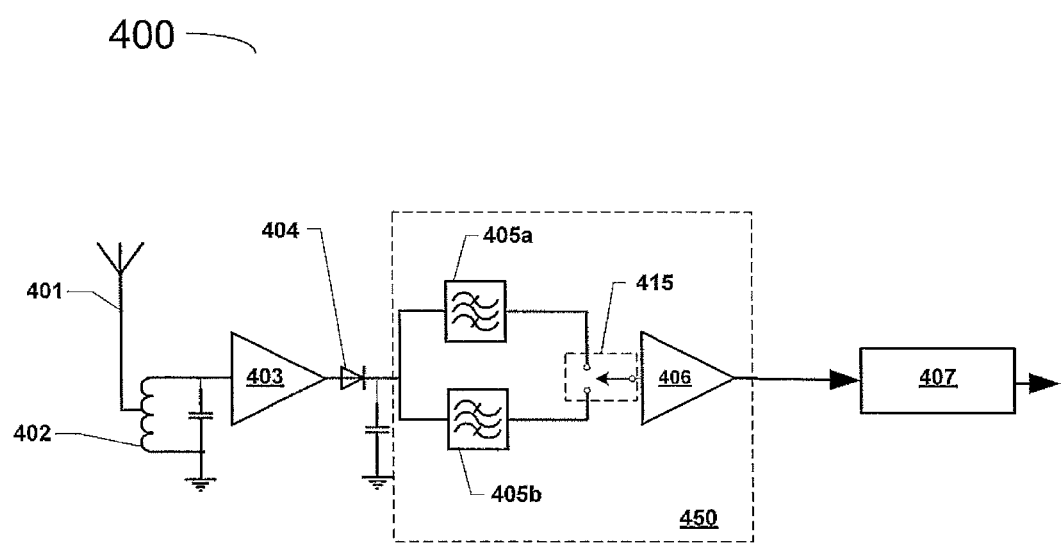
FIG. 4 illustrates a partial block diagram of a radio device, according to embodiments disclosed herein.

FIG. 4 illustrates a partial block diagram of a radio device 400 according to embodiments disclosed herein. Antenna 401, channel tuning element 402, RF amplifier 403, and RF demodulator stage 404 in radio device 400 may be as described in detail above in relation to corresponding elements 101, 102, 103, and 104 in Radio device 100 (cf. FIG. 1). Radio device 400 may include EMI rejection circuit 450, according to some embodiments. EMI rejection circuit 450 includes band-pass filters 405a and 405b, a switch 415 to select between filter 405a and 405b, and an amplifier 406. Decoder 407 in radio device 400 may be as decoder 107 described above in relation to radio device 100.

Filters 405a and 405b may have different gain and bandwidth, according to some embodiments. EMI circuit 450 performs an energy measurement on the signal to discern if the signal matches the description of a likely broadcast from a compatible transmitter or from an interferer. According to some embodiments, filter 405a has a narrow bandwidth, and filter 405b has a broader bandwidth.

A narrow band filter 405a according to some embodiments may include a crystal based filter that has a bandwidth narrower than a data channel bandwidth. According to some embodiments, filter 405a is a narrow filter with sharp roll-off. Using a low bandwidth beacon signal 202 (cf. FIG. 2A) and a correspondingly small bandwidth filter 405a has the effect of 2000 is desirable. Using conventional discrete components it is difficult and expensive to realize filters having Q>100. Piezo-crystals, on the other hand, are attractive for stability, cost, size and Q, but most general purpose circuit applications result in extremely high Q (typically >30,000), giving very slow response.

For example, a crystal based filter used for filter 405a may have a bandwidth much narrower than signal 205 (cf. FIG. 2A), according to some embodiments. In some embodiments, filter 405a may be a piezo-material based, narrow band filter. Filters coupling piezo-materials in series or parallel configurations have extremely narrow bandwidth. This may hinder the performance of EMI circuit 450 due to a slow response. In some embodiments filter 405a may include a circuit to broaden the bandwidth of a piezo-crystal to the desired levels for EMI circuit 450. Thus, filter 405a may include a piezo-crystal and a circuit to obtain a pass band that is much narrower than the bandwidth of signal 205 but broader than the bandwidth of filters that traditionally employ a piezo-crystal in series or in parallel resonance mode.

In some embodiments, filter 405b is a wide band filter. For example, filter 405b may have a bandwidth that is much wider than signal bandwidth 205. Filter 405b may be much wider than the operating bandwidth of a typical communication system. In some embodiments, the bandwidth is comparable to bandwidth 200 (cf. FIG. 2A).

EMI circuit 450 includes a switch 415 to select a signal from filter 405a and from filter 405b. The signal is amplified by amplifier 406 and further decoding and processing is done in decoder 407. In decoder 407 a determination is made whether the RF energy being detected is EMI 220, or a true signal 205. The determination is made by comparing the signal received from filter 405a and the signal received from filter 405b. A detailed description of the comparison process between the signals form filters 405a and 405b is given in relation to FIGS. 5A-5D, below.

FIG. 5A illustrates a partial view of a spectrum of EMI 220 and data portion 205, overlapping the operation parameters of a receiver according to embodiments disclosed herein. FIG. 5A also illustrates signal channel bandwidth 200 of data portion 205 centered at the frequency of beacon signal 202, (cf. FIG. 2A). In FIG. 5A illustrates amplitude 516 (A) of EMI 220, amplitude 515 (B) of signal 205 that in some embodiment may be used as beacon.

FIG. 5B illustrates a partial view of the operation parameters of a receiver, according to embodiments disclosed herein. FIG. 5B illustrates a schematic representation of a narrow bandpass filter 510 having bandwidth 501(Bw1) and gain factor 511 (G1). FIG. 5B also illustrates a schematic representation of a broad bandpass filter 520 having bandwidth 502(Bw2) and gain factor 521(G2). In some embodiments consistent with the present disclosure, the operation characteristics of bandpass filter 510 may be used for filter 405a in radio device 400 (cf. FIG. 4, above). Further embodiments may use the operation characteristics of bandpass filter 520 for filter 405b in radio device 400.

Figure 5C:
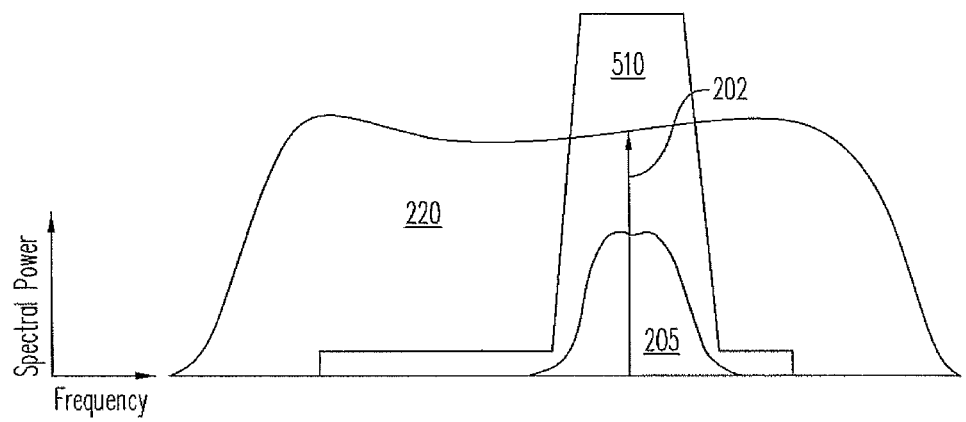
FIG. 5C illustrates a partial view of a spectrum of an EMI and a signal, overlapping the operation parameters of a receiver according to embodiments disclosed herein.
Figure 5C:
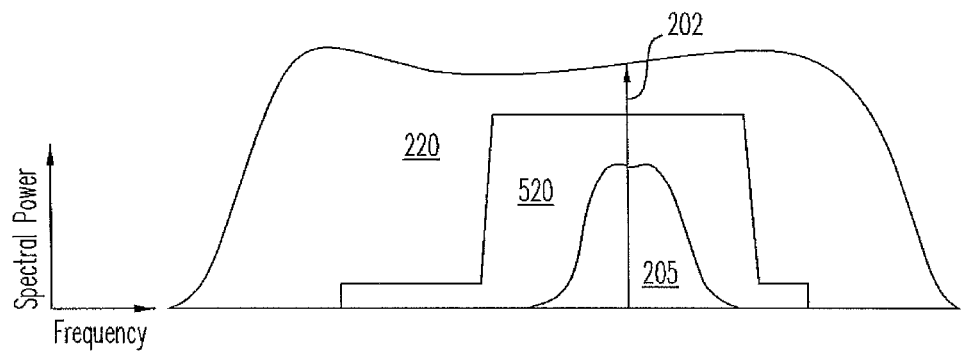

FIG. 5C illustrates a partial view of a spectrum of EMI 220 and signal 205, overlapping the operation parameters of a receiver according to embodiments disclosed herein. Filters 510 and 520 have different gain G and bandwidth Bw. Thus, by comparing the signal measured by each of filter 510 and 520 it is possible to determine if the signal is comes form a true communication partner or is EMI.

Figure 5D:
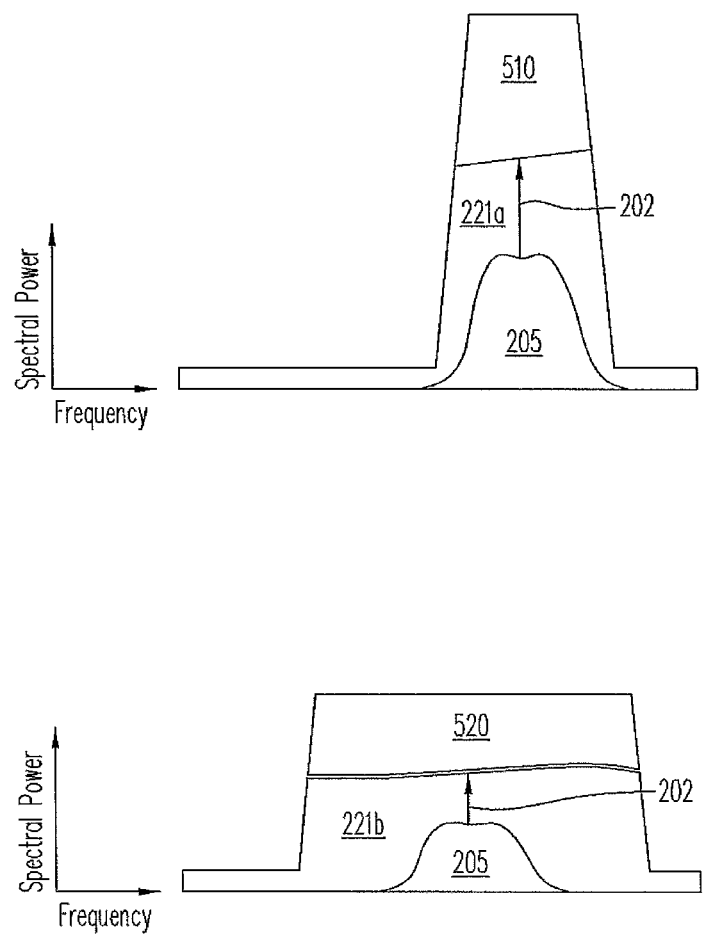
FIG. 5D illustrates a partial view of a spectrum of an EMI and a signal, overlapping the operation parameters of a receiver, according to embodiments disclosed herein.

FIG. 5D illustrates a partial view of a spectrum of EMI 220 and signal 205, overlapping the operation parameters of a receiver, according to embodiments disclosed herein. FIG. 5D illustrates an overlapping interference portion 221a in the case of filter 510, and an overlapping interference portion 221b in the case of filter 520. Also, FIG. 5D illustrates signal 205 overlapping entirely with pass-bands 501 and 502 in filters 510 and 520, respectively.

In the following, a couple of configurations for filters 510 and 520 will be described in detail by way of example. It should be noted that the examples below are illustrative only, and not limiting. Furthermore, in some embodiments of the examples given below the characteristics of filter 510 may be used in radio receiver 400 for filter 405a. Also according to embodiments consistent with the present disclosure the characteristics of filter 520 may be used in radio receiver 400 for filter 405b. Symbols used in the mathematical expressions provided below are related to labels in the figures according to Table II, below.

TABLE II

FILTER PARAMETERS FOR AN EMI REJECTION CIRCUIT

| Parameter | Symbol | Filter 510 | Filter 520 |
|---|---|---|---|
| Pass Gain | G | $G_1$ (511) | $G_2$ (521) |
| Lower Pass Frequency | FL | $FL_1$ | $FL_2$ |
| Upper Pass Frequency | FU | $FU_1$ | $FU_2$ |
| Bandwidth | Bw | $Bw_1$ (501) | $Bw_2$ (502) = N · $Bw_1$ |
| Condition | — | $Bw_1$ closely overlaps signal bandwidth C (200) | $Bw_2$ is much wider than signal bandwidth C (200) and overlaps it. |

Filter 510 may be selected for a large gain 511 and narrow bandwidth 501 matching signal channel bandwidth 200 (cf. FIGS. 2 and 5B, above). In some embodiments, bandwidth 501 is much narrower than signal channel bandwidth 200.

Figure 6A:
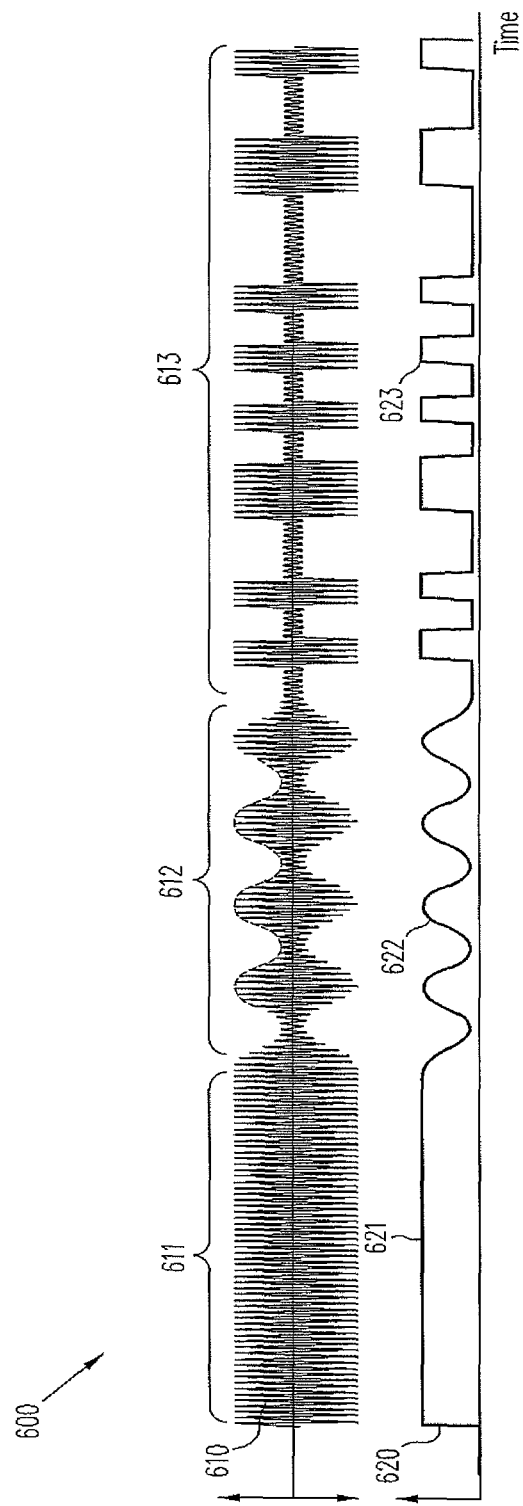
FIG. 6A illustrates a partial view of a waveform including a wakeup signal, according to embodiments disclosed herein.
Figure 6B:
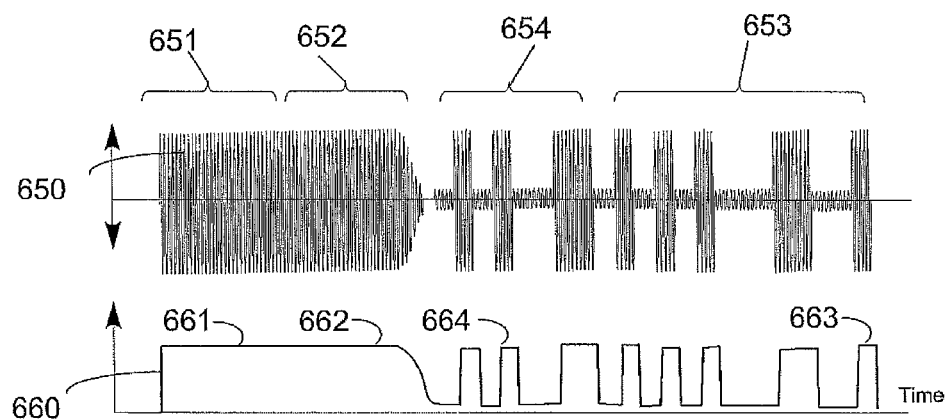
FIG. 6B illustrates a partial view of a waveform including a wakeup signal, according to embodiments disclosed herein.

Yet, bandwidth 501 may be selected to be wide enough such that it can respond to even 50% duration of the beacon modulation waveform (cf. FIGS. 6A & 6B).

In some embodiments, a typical bandwidth 501 of a few KHz is suggested in the application described here, but it could be different for other applications. In some embodiments, filter 520 is designed for a bandwidth 502 that is 'N' times that of Filter 510, where 'N' is a real number greater than one (1) $Bw_2 = N \cdot Bw_1$.

When filter 510 is activated, the output signal is measured. In embodiments such as radio receiver 400, filter 405a having the characteristics of filter 510 may be activated by flipping switch 415 accordingly (cf. FIG. 4). The output signal may be a first measurement performed in amplifier 406. When switch 415 is turned to filter 405a, the power PS510 due to a data portion 205 measured at amplifier 406 is:

$$PS_{510} = G_1 \int_{FL_1}^{FU_1} P_{signal}(f) df \approx G_1 \cdot B \cdot Bw_1 = G_1 \cdot B \cdot C, \quad (1)$$

where B is signal amplitude 515 (cf. FIG. 5A). When switch 415 is turned to filter 405a, the power PI510 due to EMI measured at amplifier 406 is $$PI_{510} = G_1 \int_{FL_1}^{FU_1} P_{EMI}(f) df \approx G_1 \cdot A \cdot Bw_1, \quad (2)$$

where A is EMI amplitude 516 (cf. FIG. 5B).

In embodiments consistent with the present disclosure the output signal is also measured when filter 520 is activated. In embodiments such as radio receiver 400, filter 405b having the characteristics of filter 520 may be activated by flipping switch 415 accordingly (cf. FIG. 4). The output signal may be a second measurement performed in amplifier 406. When switch 415 is turned to filter 405b, the power PS520 due to a true signal measured at amplifier 406 is:

$$PS_{520} = G_2 \int_{FL_2}^{FU_2} P_{signal}(f) df \approx G_2 \cdot B \cdot C, \quad (3)$$

where B is signal amplitude 515 (cf. FIG. 5A) and the signal has a data portion 205 with bandwidth C. When switch 415 is turned to filter 405b, the power PI520 due to EMI measured at amplifier 406 is $$PI_{520} = G_2 \int_{FL_{21}}^{FU_2} P_{EMI}(f) df \approx G_2 \cdot A \cdot Bw_2. \quad (4)$$

In embodiments consistent with the present disclosure, $Bw_1$ (501) is set to signal bandwidth C (200). Further, in some embodiments gain and bandwidth of filters 510 and 520 are chosen so that $$G_1 \cdot Bw_1 = G_2 \cdot Bw_2 \quad (5)$$

This keeps EMI output nearly similar between filters 510 and 520 (PI510~PI520, cf. Eqs. (2,4)). In this configuration, signal power (without EMI) changes by a factor $G_1/G_2$: PS520~(G2/G1)·PS510 (cf. Eqs. (1, 3)), when switch 415 goes from filter 405a to filter 405b.

Thus, in configurations as described in Eq. (5), when filter 510 and filter 520 render comparable signal strength, the signal source is most likely EMI 220. Also in configurations as described in Eq. (5), when filter 510 output is greater than the output of filter 520, the signal source is most likely a valid communication partner transmitting data portion 205.

In some embodiments, gain and bandwidth of filters 510 and 520 may be arranged as follows:

$$G_1 = G_2;\qquad(6)$$

In this case, PS520~PS510, while PI520~(Bw$_2$/Bw$_1$)·PI510 (cf. Eqs. (1-4)). Thus, in configurations consistent with Eq. (6) when the signal output from filter 510 and the signal output from filter 520 are comparable the signal source 205 is most likely a valid communication partner. Further according to a configuration consistent with Eq. (6), when the signal output from filter 520 is distinctly greater than the signal output from filter 510, the signal source is most likely EMI.

Some embodiments consistent with Eq. (5) may further include the following configuration for the operational parameters of filters 510 and 520: N=3 (i.e. Bw$_2$=3·Bw$_1$), G$_1$=1, and G$_2$=1/N=0.333. In such configuration, a scenario may arise where strong EMI 220 is transmitted while there is no data signal, or a comparatively weak data portion signal 205. In such scenario, the total output power at amplifier 406 may be 'X' when filter 510 is activated (e.g. filter 405a, cf. FIG. 4). When filter 520 is activated (e.g. by flipping switch 415 onto filter 405b, cf. FIG. 4), the total output power at amplifier 406 remains approximately equal to 'X'.

In the same configuration as above, a different scenario may include a strong data portion signal 205 with negligible EMI 220. In such scenario, the total output power at amplifier 406 may be 'Y', when filter 510 is activated (e.g. filter 405a, cf. FIG. 4). When filter 520 is activated (e.g. by flipping switch 415 onto filter 405b), the total output power at amplifier 406 will drop to 'Y/3'.

Thus, in embodiments consistent with Eq. (5) the power at amplifier 406 in a configuration when filter 405a (510) is 'on' is compared to the power at amplifier 406 when filter 405b (520) is 'on'. If there is no substantial change in power level, it can be deduced that the received wireless signal is from an EMI source. If there is substantial change in power level (say by a factor of 1.5), it can be deduced that the received wireless signal is from a compatible signal transmitter.

Some embodiments consistent with Eqs. (6.1) and (6.2) may include a setup with G$_1$=G$_2$=1, and N=4 (i.e. Bw$_2$=4·Bw$_1$). In such configuration, a scenario may arise with strong EMI 220, and negligible data portion signal 205. Then, an output power V may be measured at amplifier 406 with switch 415 flipped to filter 405a (510). In a strong EMI scenario, when switch 415 is flipped to filter 405b (520), the output power at amplifier 406 may be approximately '4J'.

Using the above configuration a scenario may arise with strong signal 205 and negligible EMI 220. Then, an output power 'K' may be measured at amplifier 406 with switch 415 flipped to filter 405a (510). In such scenario, when switch 415 is flipped to filter 405b (520), the output power at amplifier 406 will be approximately equal to 'K'.

Thus, in embodiments consistent with Eqs. (6.1) and (6.2), the power at amplifier 406 in a configuration when filter 405a (510) is 'on' is compared to the power at amplifier 406 when filter 405b (520) is 'on'. If there is no substantial change in power level, it can be deduced that the received wireless signal is from a compatible signal transmitter. If there is substantial change in power level (say by factor of 2), it can be deduced that the wireless signal is from an EMI source.

According to embodiments consistent with the present disclosure the ratio of Bw$_2$/Bw$_1$ may be a figure of merit of an EMI rejection circuit. For example, if filter 405b has bandwidth 520 of 30 KHz, and filter 405a has bandwidth 510 of 3 KHz, a figure of merit for EMI rejection circuit 450 is 10. Some embodiments consistent with methods and systems disclosed herein are particularly suitable for receiver circuits having sufficient dynamic range in the amplifier chain. The dynamic range of a circuit can be enhanced by various techniques such as, but not limited to, use of low noise receivers and amplifiers; use of Automatic Gain Control (AGC) circuits; and greater amplifier output compliance (voltage or current compliance). According to embodiments consistent with this disclosure, at least one of filters 510 and 520 may be an LCR tuned circuit (L-inductance, C-Capacitance, R-Resistance). For example, some embodiments include a filter using an LCR circuit with a programmable resistance R.

A radio device as disclosed herein includes an EMI rejection function (in software or hardware, using analog or DSP processing). The radio device may include a narrow band filter such as filter 510, and a wideband filter, such as filter 520. Furthermore, the radio receiver may perform a function to compare signal power measured using a narrow band filter to the signal power measured using a wide band filter. A logic circuit or program may determine if a signal is from a desired communication partner or an EMI. In some embodiments as disclosed herein a wide band filter may have a bandwidth greater than the bandwidth of a waveform for a wakeup signal expected from a desired communication partner. Further according to some embodiments a radio device may include a narrow band filter such as filter 510 with a bandwidth 501 matching the bandwidth of wakeup waveform expected from a desired communication partner, such as beacon signal 202.

In some embodiments, a radio device may include filter 510 having bandwidth 501 narrower than the bandwidth of a wakeup waveform expected from a desirable communication partner. Details related to a waveform for a wakeup signal according to embodiments described herein will be provided below in relation to FIGS. 6A and 6B.

FIG. 6A illustrates a partial view of a waveform 610 including a wakeup signal, according to embodiments disclosed herein. FIG. 6A illustrates the time waveform 610 of a signal received by a radio device as disclosed herein. Waveform 610 may be an RF signal including a CW modulation portion 611, followed by beacon signal portion 612 and a data portion 613.

Portion 611 occurs at carrier frequency according to some embodiments. Portion 611 is used to energize a low power energy based discrimination circuit that validates and reduces the probability of a false wakeup due to EMI. In some embodiments, after validation is complete more sophisticated electronics for data demodulation or decoding turn on.

Modulation 612 may include one or more of the following modulation techniques: amplitude-modulation (AM); single tone modulation; multiple tones in time sequence; multiple tones at the same time. Modulation 612 may also include digital signal modulation techniques such as: frequency-shift keying (FSK); pulse code modulation (PCM); and pseudo-random-noise (PN-Code) technique using on-off keying (OOK) or amplitude-shift keying (ASK).

FIG. 6A also illustrates the output of a detector corresponding to waveform 620. For example, in some embodiments consistent with the present disclosure waveform 620 may be the envelope of signal 610 obtained at the output of RF-demodulator 104 or 404 (cf. FIGS. 1 and 4). Waveform 620 includes CW portion 621, modulation portion 622, and data portion 623.

Portion 621 may be used as CW energy detector in some embodiments. Portion 622, also referred to as wakeup portion, may be used in some embodiments to determine whether signal 610 is transmitted by a desired communication partner or is EMI from a nonrelated system. Upon detecting the communication request, a receiver may operate at a higher gain or activates a preselected filter, amplifier or demodulator.

FIG. 6B illustrates a partial view of a waveform including a wakeup signal 640, according to embodiments disclosed herein. Waveforms 650 and 660 may be as described in detail above in relation to waveforms 610 and 620.

Waveform 650 may be an RF signal that uses sub-carrier frequency fsc modulation including a CW modulation portion 651. The sub-carrier frequency fsc may also be a valid beacon signal 652. Waveform 650 includes a data portion 654 and 653.

Portion 651 occurs at sub-carrier frequency. Portion 651 is used to energize a low power energy based discrimination circuit that validates and reduces the probability of a false wakeup due to EMI. In some embodiments, after validation is complete more sophisticated electronics for data demodulation or decoding turn on.

Modulation 652 may include one or more of the following modulation techniques: single tone modulation (at Fsc or nearby frequency); multiple tones in time sequence; multiple tones at the same time. Modulation 652 may also include digital signal modulation techniques such as: frequency-shift keying (FSK); Phase sift keying (PSK); pulse code modulation (PCM); and pseudorandom-noise (PN-Code) technique using on-off keying (OOK) or amplitude-shift keying (ASK).

Some embodiments may use the sub-carrier itself as the beacon signal. Thus 651 and 652 could be one and the same signal.

Waveform 660 is an envelope of waveform 650, as obtained from second demodulator (to demodulate Sub-Carrier Fsc). Also, waveform 650 may include a CW modulation portion 651, a wakeup portion 652, and a data portion 653. Waveform 660 includes similar counterparts to waveform 650, that is, CW modulation portion 661, wakeup portion 662, and data portion 663. Further according to some embodiments, waveform 650 may include a PN modulation portion 654 after wakeup portion 652. According to embodiments disclosed herein, PN modulation portion 654 may be used in combination with DSP to further distinguish between a true communication partner and an EMI source.

Some embodiments may not use the 611 or 651 CW waveform in FIGS. 6A and 6B and instead start with beacon signal 612, 652.

Figure 6C:
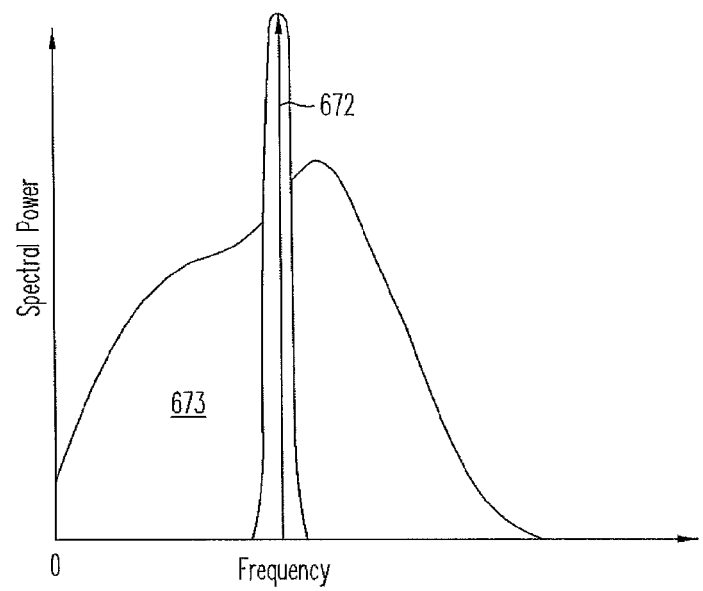
FIG. 6C illustrates a partial view of a spectrum for a waveform in a signal according to embodiments disclosed herein.

FIG. 6C illustrates a partial view of a spectrum for a waveform in a signal according to embodiments disclosed herein. FIG. 6C illustrates a beacon signal 672 and a data portion 673 in a signal received after an RF de-modulator in a radio device consistent with embodiments disclosed herein. For example, in some embodiments the spectrum shown in FIG. 6C, may be the RF spectrum of a signal after RF demodulator 104 in radio device 100 (cf. FIG. 1). FIG. 6C corresponds to the spectrum representation of waveform 610 illustrated in FIG. 6A. A waveform as 610 having a spectral profile as shown in FIG. 6C may correspond to a signaling configuration using base band modulation. Thus, beacon signal portion 612 in waveform 610 may have a spectrum as beacon signal 672. Data portion 613 may have a spectrum as data portion 673.

Figure 6D:
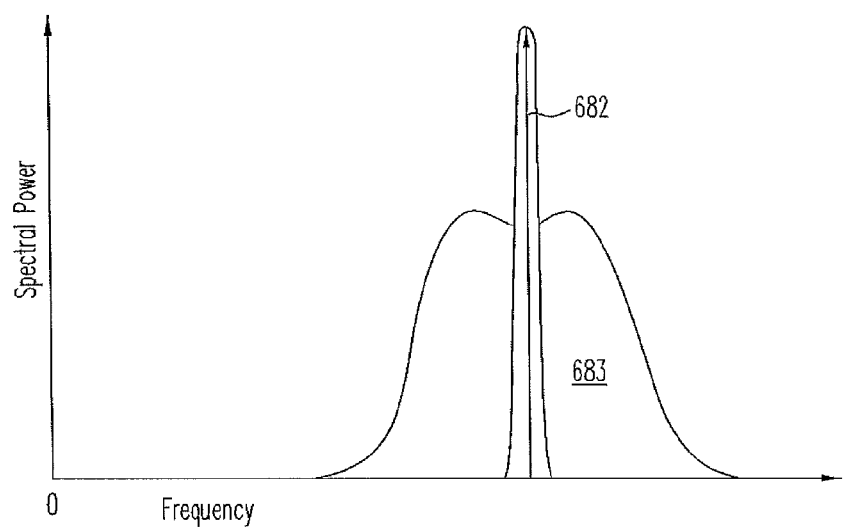
FIG. 6D illustrates a partial view of a spectrum for a waveform in a signal according to embodiments disclosed herein.

FIG. 6D illustrates a partial view of a spectrum for a waveform in a signal according to embodiments disclosed herein. FIG. 6D illustrates beacon signal 682 and data portion 683 in a signal received at a sub-carrier frequency fsc. FIG. 6D corresponds to the spectrum representation of waveform 650 illustrated in FIG. 6B. Thus, beacon signal 682 may be the spectral representation of beacon portion 651 and beacon portion 652. Also, data portion 683 may be the spectral representation of data portion 653.

Figure 7A:
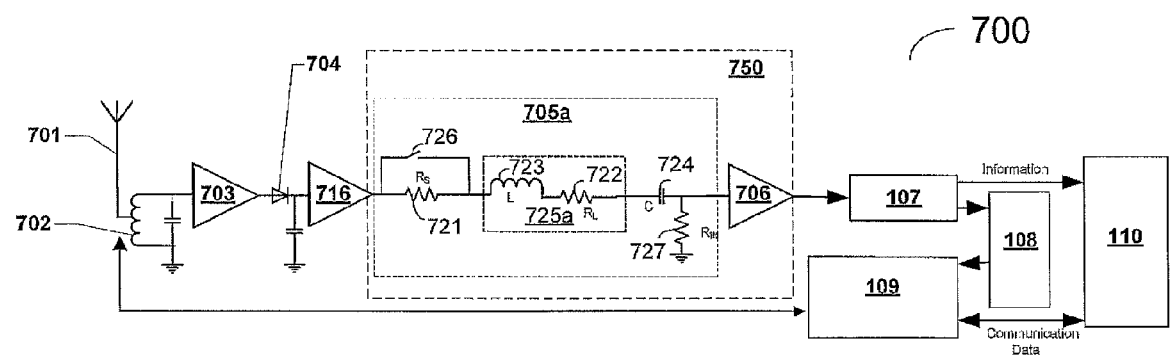
FIG. 7A illustrates a partial block diagram of a radio device, according to embodiments disclosed herein.

FIG. 7A illustrates a partial block diagram of a radio device 700, according to embodiments disclosed herein. Radio device 700 includes EMI rejection circuit 750. EMI rejection circuit 750 includes a variable filter 705a, using an LCR circuit. LCR circuit in circuit 705a may be realized using either series resonance or parallel resonance. Circuit 705a has a resonance frequency fo and a reactance of inductor 723 (L) or capacitor 724 (C) at fo, Xfo. Resistor 722 (RL) is the resistive loss of L and C. Resistor 721 (Rs) is the programmed damping to change the Q of circuit 705a to set a desired bandwidth 502 (cf. FIG. 5B). Resistor 727 (Rin) is the input resistance.

According to embodiments disclosed herein, a first filter 510 is realized when switch 726 is closed. The first bandwidth 501 (Bw1) of circuit 705a in this configuration is given by $$Bw_1 = f_0 \cdot \frac{R_L}{X_{f0}} \tag{7}$$

When switch 726 is closed a passband gain 511 ($G_1$) of first filter 510 is approximately equal to $$G_1 \approx R_{IN}/(R_L+R_N) \tag{8}$$

A second filter 520 is realized when switch 726 is open. The second bandwidth 502 (Bw2) of circuit 705a in this configuration is =

$$Bw_2 = f_0 \cdot \frac{(R_L + R_S)}{X_{f0}} \tag{9}$$

When switch 726 is open a gain 521 (G2) of second filter 520 is approximately equal to $$G_2 \approx R_{IN}/(R_L+R_S+R_{IN}) \tag{10}$$

Thus, according to embodiments disclosed herein, switch 726 changes the bandwidth of LCR circuit 705a from a first configuration (filter 510) to a second configuration (filter 520). This methodology can be used for an arbitrary range of filter bandwidth ratios, with or without change of filter gain between filter 510 and filter 520. Further according to some embodiments, EMI rejection circuit 750 measures the change in detected signal power between the two configurations of switch 726. In some embodiments, EMI rejection circuit 750 may use a discrimination threshold in amplifier 706 to distinguish between a first signal power proportional to $G_1 \cdot Bw_1$ and a second signal power proportional to $G_2 \cdot Bw_2$ (cf. Eqs.(3,4, 7-10)).

In some embodiments, circuit 705a may be used at a later stage in a communication protocol with a desired partner. Thus, multiple use of circuit 705a may enable to adjust the bandwidth to a convenient level, when communication with a desired partner has been established.

Figure 7B:
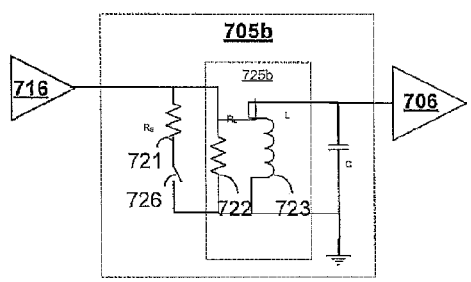
FIG. 7B illustrates a partial block diagram of a circuit with switchable bandwidth, according to embodiments disclosed herein.

FIG. 7B illustrates a partial block diagram of a circuit 705b with switchable bandwidth, according to embodiments disclosed herein. Filter 705b may be used in place of circuit 705a in EMI rejection circuit 750 (cf. FIG. 7A). Capacitor (C), inductor (L), resistor (R), and switch 726 elements in circuit 705b are as described in detail in FIG. 7A.

According to embodiments disclosed herein, a radio device may include narrow band filter 510 or wideband filter 520 having adjustable bandwidths. In some embodiments, the adjustable bandwidth is selected to pass signal for spectrum of relevant wakeup portion or beacon signal 202 (cf. FIG. 2A). Further, the adjustable bandwidth may be selected to detect a portion of waveform expected from compatible communication partner after a wakeup portion has been processed. A portion of waveform received after a wakeup portion may include a data payload such as data portion 205 (cf. FIG. 2A). The data payload may be a digital or analog data payload, according to some embodiments. For example, in some embodiments a wakeup portion of a signal waveform may be as wakeup portions 612 and 652, and a data payload may be as data portion 613 and 653 (cf. FIGS. 6A and 6B).

Figure 8A:
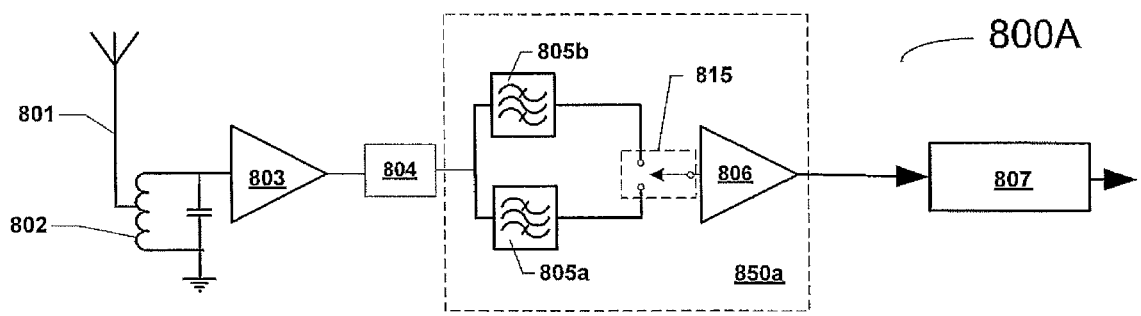
FIG. 8A illustrates a partial block diagram of a radio device, according to embodiments disclosed herein.

FIG. 8A illustrates a partial block diagram of a radio device 800A, according to embodiments disclosed herein. Radio device 800A includes antenna 801, channel-tuning element 802, RF amplifier 803, demodulator 804, and decoder 807. The above circuit elements may be as described in detail above in relation to antenna 103, channel tuning element 102, RF amplifier 103, demodulator 104, and decoder 107 for radio device 100 (cf. FIG. 1). Radio device 800A includes EMI rejection circuit 850a including a narrow band filter 805a and a broadband filter 805b. In some embodiments, narrow band filter 805a may have operational parameters according to filter 510 (cf. FIG. 5B). Broad band filter 805b may have operational parameters according to filter 520 (cf. FIG. 5B). In radio device 800A, the comparison of signal strength between narrow band filter 805a and broad band filter 805b is performed sequentially by flipping switch 815.

Figure 8B:
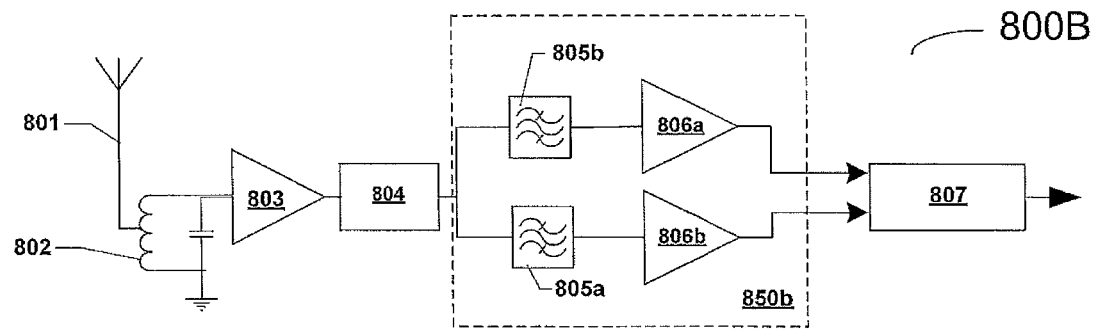
FIG. 8B illustrates a partial block diagram of a radio device, according to embodiments disclosed herein.

FIG. 8B illustrates a partial block diagram of a radio device 800B, according to embodiments disclosed herein. Elements in radio device 800A and radio device 800B having like reference numerals have like characteristics as well. Radio device 800B includes an amplifier 806a and an amplifier 806b for each of filter 805a and filter 805b. The signal from amplifiers 806a and 806b may be processed concurrently, according to embodiments consistent with the present disclosure. For concurrent processing, the signal from each of filters 805a and 805b is processed in parallel in decoder 807.

Figure 9A:
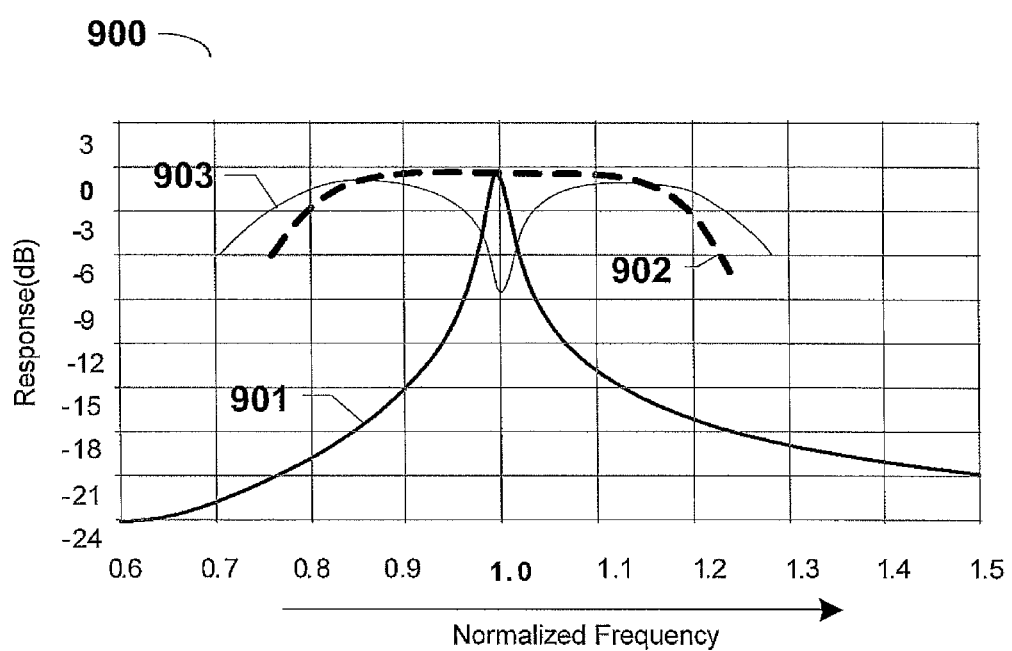
FIG. 9A illustrates a partial view of operation parameters of a receiver, according to embodiments disclosed herein.

FIG. 9A illustrates a partial view of operation parameters of a receiver, according to embodiments disclosed herein. FIG. 9A illustrates a normalized frequency in the abscissas, and a receiver response in a logarithmic scale in the ordinates (dB). A normalized frequency scale is such that the center frequency of a receiver response is equal to one (1), and all other frequencies are plotted in proportion to the center frequency. According to embodiments disclosed herein, the center frequency of a receiver response may be a beacon signal frequency from beacon signal 202 (cf. FIG. 2A). Curve 901 shows a typical response of a narrow band filter. For example, curve 901 may be the response of filter 510 (cf. FIG. 5B). Curve 902 shows the response of a broadband filter, according to some embodiments. For example, curve 902 may be the response of filter 520 (cf. FIG. 5C). In curve 902, the −3 dB bandwidth is much wider than the response of the narrow band filter (cf. curve 901).

According to some embodiments consistent with the present disclosure, curve 903 may be the response curve of a broadband filter. Curve 903 may be the response of filter 520 according to some embodiments. Curve 903 includes a notch filter at the center frequency (=1.0). The −3 dB bandwidth of a filter as in curve 903 is much wider than the response of a filter as in curve 901. Using a broadband filter having a response curve as in curve 903 provides a measurement of out-of-band wide band EMI spread around a peak response at the center frequency of expected signal. Thus, some embodiments of a radio device may include a first filter 510 with a response at a center frequency as in curve 901, and a second filter 520 with a response as in curve 903. In this configuration, the response of filter 510 and filter 520 is complemented to one another. Thus, a signal provided by filter 520 may include substantially EMI components, and a signal provided by filter 510 may include substantially a signal from a trusted communication partner.

In some embodiments, a radio communication system as disclosed herein includes a wide band filter such as filter 520 having a notch filter (curve 903). Thus, in some embodiments filter 520 substantially rejects signals from spectrum of relevant wakeup waveform or beacon signal expected from compatible communication partner. Such a wakeup waveform may be as 612 or 652 (cf. FIGS. 6A and 6B, above). This may be used to further refine EMI discrimination algorithm.

Figure 9B:
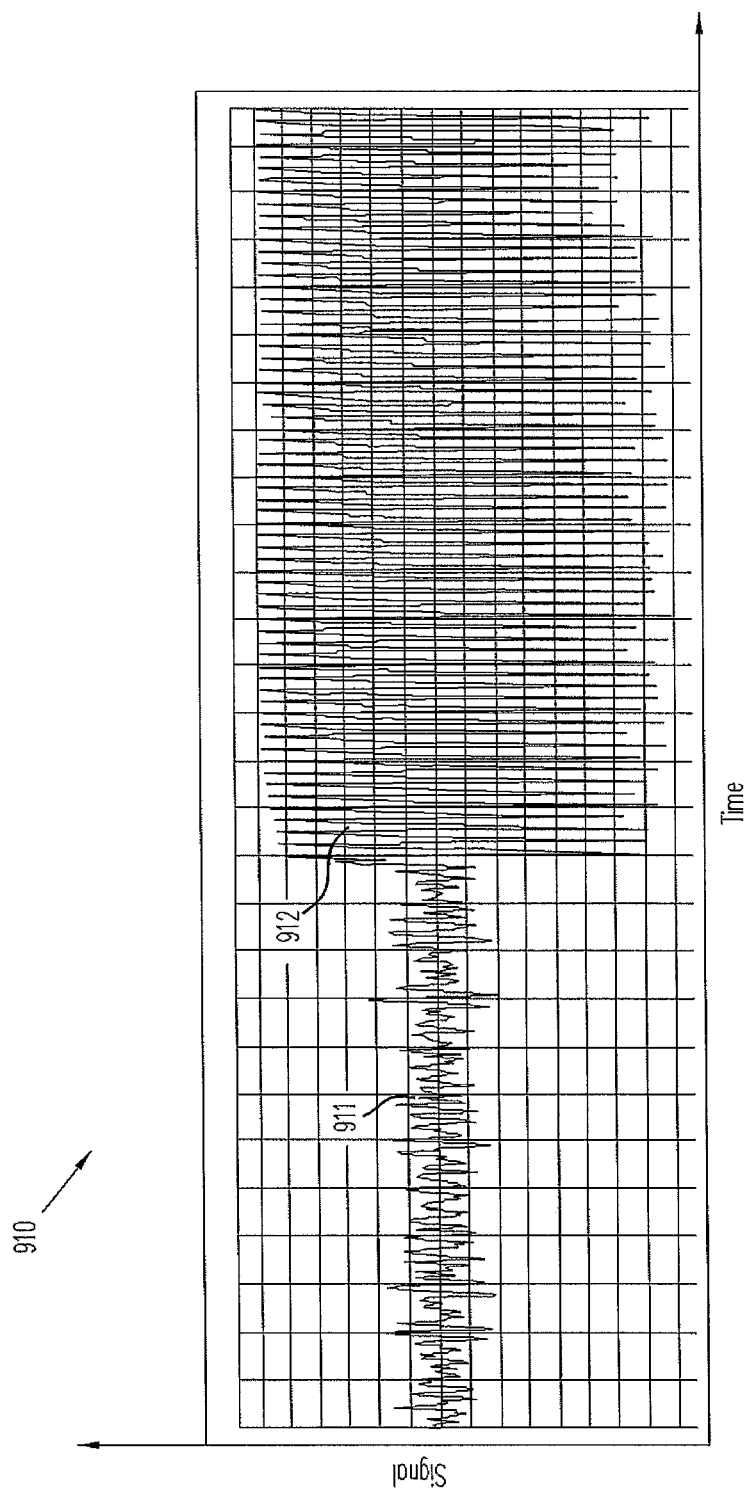
FIG. 9B illustrates a partial view of a waveform including a noise portion and a signal portion, according to embodiments disclosed herein.

FIG. 9B illustrates a partial view of a waveform 910 including a noise portion 911 and a signal portion 912, according to embodiments disclosed herein. Waveform 910 may be transmitted from a trusted communication partner to be received by a radio device according to embodiments disclosed herein. Waveform 910 may be a portion of waveform 610 or waveform 650 (cf. FIGS. 6A and 6B). Noise portion 911 may be a quiescent noise detected by a radio receiver when turned 'on' even in the absence of any RF signal (including a true signal or EMI). FIG. 9B shows typical noise floor 911 and a clean CW subcarrier signal pulse 912 from a communication partner.

Figure 9C:
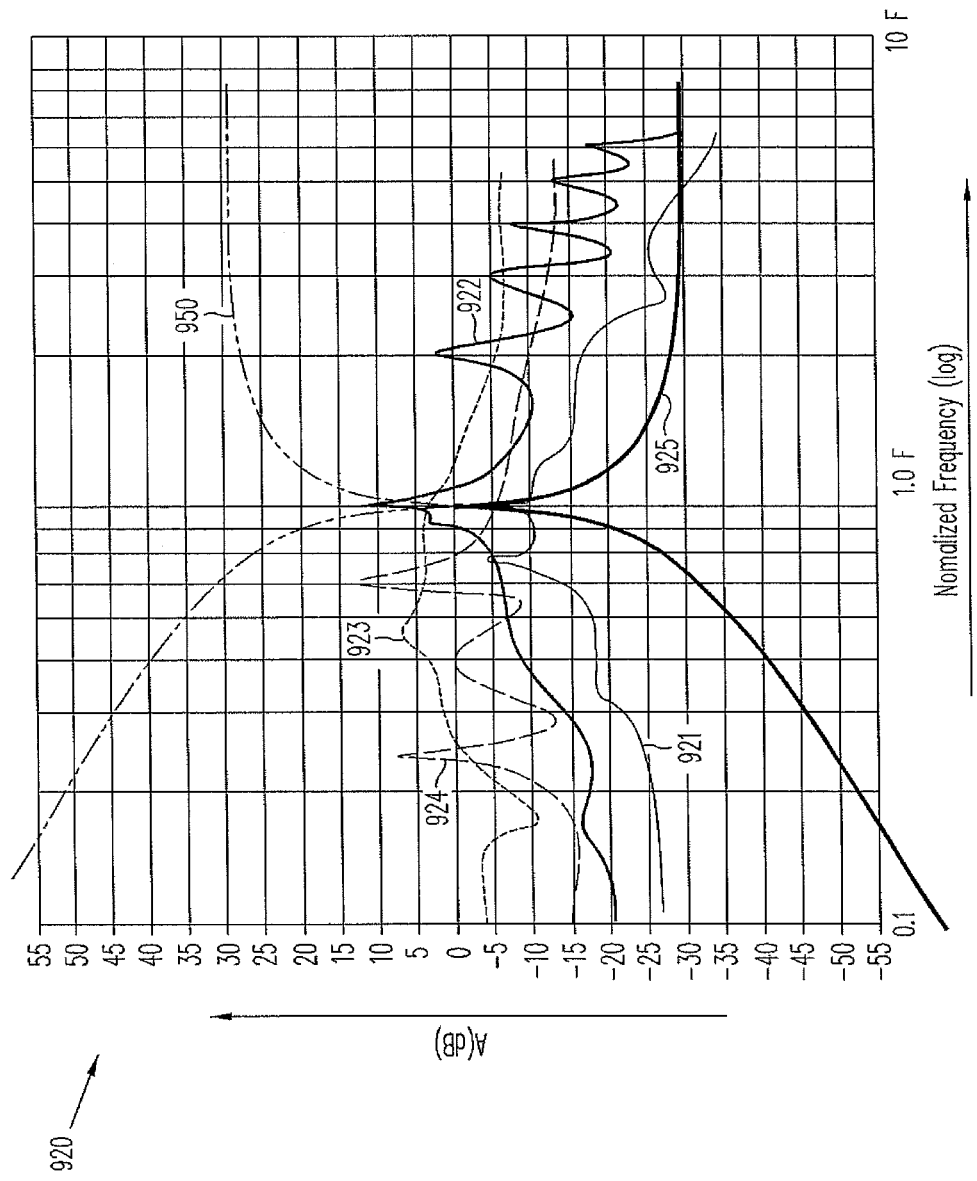
FIG. 9C illustrates a partial view of spectra from interferences and a signal, overlapping the operation parameters of a receiver according to embodiments disclosed herein.

FIG. 9C illustrates a partial view of spectra from interferences 923, 924 and a signal 922, overlapping the operation parameters of a receiver 925 according to embodiments disclosed herein. FIG. 9C illustrates a normalized frequency in the abscissas, and a response amplitude A in a logarithmic scale in the ordinates (dB). A normalized frequency scale is such that the center frequency of a receiver response is equal to one (1), and all other frequencies are plotted in proportion to the center frequency. According to embodiments disclosed herein, the center frequency of a receiver response may be a beacon signal frequency, such as beacon signal 202 (cf. FIG. 2A). FIG. 9C also illustrates a handicap curve (950) for a radio device according to embodiments disclosed herein. Handicap curve 950 is the inverse of receiver response 925. Handicap curve 950 indicates the amount of signal amplification needed for an RF signal at an arbitrary frequency to be measured by the receiver at the same level as intended signal (F=1.0). Curve 921 illustrates a quiescent noise floor spectrum, such as corresponding to quiescent noise 911 (cf. FIG. 9B). Curve 922 corresponds to the spectrum of a clean signal, such as signal 912 (cf. FIG. 9B). Curve 923 shows the spectrum of EMI due to a 801.11g WiFi device. Curve 924 shows the spectrum of EMI due to an electronic device that has power switching and high speed logic processors generating EMI that has distinct peaks. A device producing EMI curve 924 may be, for example, an LCD monitor operating in the vicinity of a radio receiver having a response curve such as curve 925.

Curve 923 in FIG. 9C appears as a broadband interference spectrum. Thus, the potential for a source of EMI as in curve 923 to contribute to signal interference at a receiver as in curve 925 is relatively low. An LCD monitor as in curve 924 shows a few prominent peaks not aligned with the center frequency (F=1.0). In curve 924, the signal at fsc (F=1.0) is suppressed by more than 30 dB relative to the closest peak (at about F=0.7). In curve 924, the signal is about 17 dB below the equivalent sensitivity of a 0 dBm true signal for the receiver, at a frequency equal to fsc (F=1.0).

Figure 10A:
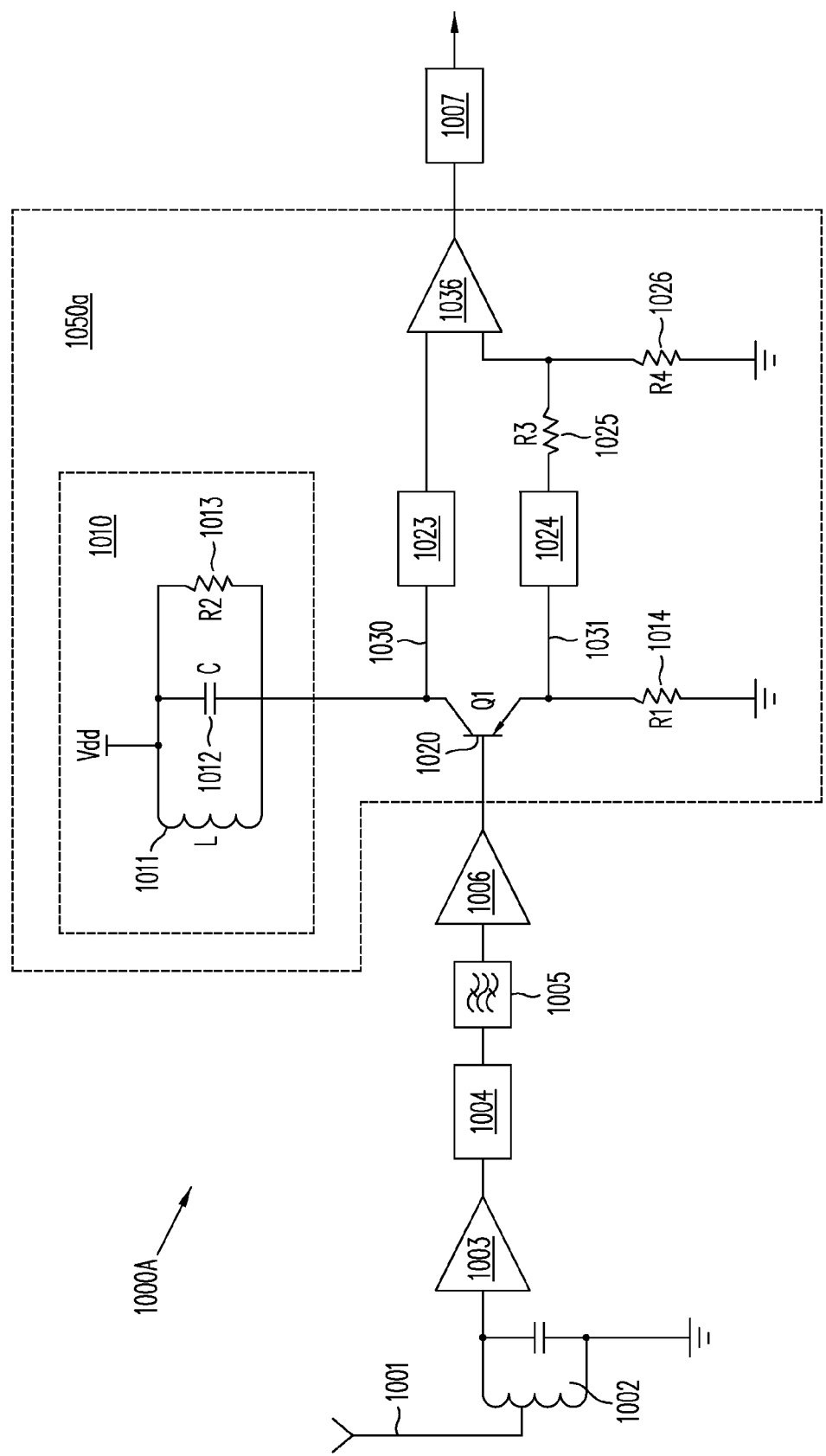
FIG. 10A illustrates a partial block diagram of a radio device, according to embodiments disclosed herein.

FIG. 10A illustrates a partial block diagram of a radio device 1000A, according to embodiments disclosed herein.

FIG. 10A shows an embodiment of a radio receiver including antenna 1001, channel-tuning element 1002, RF amplifier 1003, demodulator 1004, filter 1005, amplifier 1006, and decoder 1007. Elements 1001-1007 may be as described earlier in relation to antenna 101, channel-tuning element 102, RF amplifier 103, demodulator 104, filter 105, amplifier 106, and decoder 107 in radio device 100 (cf. FIG. 1). Radio device 1000A includes EMI rejection circuit 1050a. The signal received by EMI rejection circuit 1050a is applied to a common emitter transistor amplifier 1020 (Q1). In some embodiments, Q1 1020 may be a trans-conductance amplifier. Amplified current from amplifier 1020 flows across resistor 1014 (R1) as well as across the complex impedance generated by circuit 1010. In some embodiments, circuit 1010 is an LCR circuit with inductor 1011 (L), capacitor 1012 (C), and resistor 1013 (R2). FIG. 10A shows circuit 1010 as an LCR circuit, some embodiments may use other types of filter circuits coupled to amplifier 1020. Thus, circuit 1010 essentially fingerprints friendly broadcasts from alien broadcasts.

In radio device 1000A the signal voltage 1031 (V(R1)) across resistor 1014, is essentially the same as the voltage at the base of transistor 1020 (Q1). This is because devices 1020 and 1014 act as a voltage follower buffer. The signal voltage 1030 across circuit 1010 is frequency dependent. At a resonant frequency, f0, signal 1030 is approximately equal to Q×(X0/R1)×V(R1). X0 is the reactance of circuit 1010, approximately equal to 2π f0 L; Q is the quality-factor of circuit 1010, approximately equal to R2/X0; and f0 is the resonance frequency of circuit 1010. Due to resonance, signal 1030 has narrow bandwidth, with a bandwidth approximately equal to f0/Q. Thus, by adjusting the value of Q, the bandwidth of signal 1030 may be adjusted accordingly.

In some embodiments, radio receiver 1000A includes envelope detector 1023 and envelope detector 1024. An envelope detector such as 1023 or 1024 may be used to obtain a signal envelope from a signal waveform 1030 or 1031 such as waveform 660 is obtained from waveform 650 (cf. FIG. 6B, above). Radio receiver 1000A includes a comparator 1036. Comparator 1036 compares signals 1030 and 1031 to determine a signal to interference ratio. In some embodiments, comparator 1036 applies a safety margin between signals 1030 and 1031 to make the determination if the signal is from a compatible source or a foreign interferer.

Embodiments consistent with the present disclosure include a radio device with an EMI rejection circuit that feeds a received signal to a narrow band filter and a wide band filter. Further, the signal from the narrow band filter and the wide band filter is divided by a trans-conductance amplifier having a complex impedance on one end. In some embodiments, the trans-conductance amplifier may be a bipolar transistor or other types such as a FET transistor, with an emitter (source pin for FET transistor) generating signals for the broad band filter and a collector (Drain pin for FET transistor) generating signals corresponding to the narrow band filter. A radio device according to some embodiments may use an LCR tuned circuit as a narrow band filter collector load of the transistor. Further according to some embodiments, a radio device may include an electronically adjustable damping resistor to dynamically adjust the bandwidth of the narrow band filter by selecting the Q of the LCR circuit. The electronically adjustable damping resistor may be as resistor 1013 (R2) in FIG. 10A. Circuit 1010 with a dynamically adjustable Q and envelope detector 1023 may be used to receive signals from a portion of a waveform after the wakeup portion. For example, circuit 1010 may also be used in some embodiments to receive data portion 613 in signal 610, or data portion 653 in signal 650 (cf. FIGS. 6A and 6B).

In a radio device according to some embodiments, comparator 1036 may be a software implemented algorithm. Thus, comparator 1036 may include logical operations between narrow band signal 1030 and broadband signal 1031.

In configurations where the dynamic range of a signal is limited, some embodiments of a radio device as disclosed herein may induce signal clipping artifacts. This is described in more detail in relation to FIG. 10B, below.

Figure 10B:
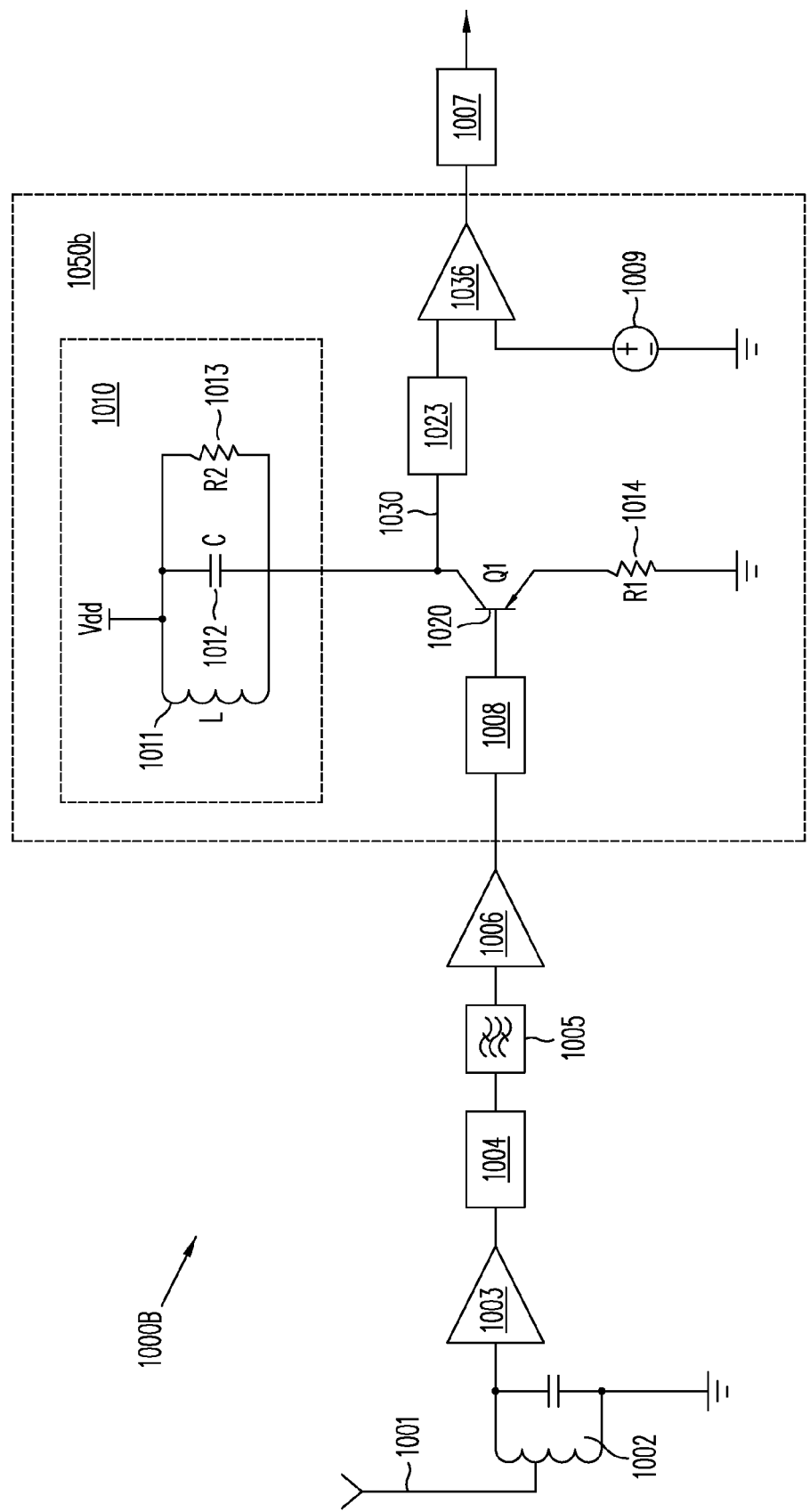
FIG. 10B illustrates a partial block diagram of a radio device, according to embodiments disclosed herein.

FIG. 10B illustrates a partial block diagram of a radio device 1000B, according to embodiments disclosed herein. Elements in FIG. 10B having like reference numerals as in FIG. 10A have like description. Radio device 1000B has an EMI rejection circuit 1050 b that operates similarly to EMI rejection circuit 1050 as far as narrow band signal 1030 is concerned. In some embodiments, EMI rejection circuit 1050 b has no wideband signal channel (cf. signal 1031 in FIG. 10A). EMI rejection circuit 1050 b may include a clipper circuit 1008, to remove signals provided by amplifier 1006 larger than a pre-selected threshold. The pre-selected threshold is used to represent maximum EMI output of wideband filter. Further, the pre-selected threshold from clipper circuit 1008 may include a safety margin. Element 1009 is a voltage source set to represent maximum EMI output of wideband filter. An artifact of clipper is that when intended signal is present the noise floor is reduced, thus SNR (Signal to Noise Ratio) is improved.

A radio device according to embodiments disclosed herein use an EMI rejection circuit having a constrained dynamic range. Thus, a ratio between quiescent noise floor and peak to peak signal swing may be selected between 10 to 30 dB, in some embodiments.

In some embodiment the maximum gain of amplifier is limited by the maximum acceptable noise-floor at the output of the amplifier.

In some embodiments consistent with the present disclosure a dynamic range of an EMI rejection circuit may be constrained by increasing an amplifier gain such that the noise floor RMS voltage is approximately 1 to 80% of available peak to peak swing. These wideband interferers have limited ability to generate energy to get past narrow band filter. Yet a narrow band signal with limited peak to peak swing can generate more energy to get past the narrow band filter.

Some embodiments consistent with the present disclosure may use equivalent DSP (Digital Signal Processing) operated by software instead of using discrete circuits. For example, some embodiments may implement DSP software in CPU 110 (cf. FIG. 1). Multiple filters with dedicated detectors can be operated in parallel.

Embodiments consistent with the present disclosure combine a narrow band beacon such as beacon signal 202 (cf. FIG. 2A) and a matching narrow band filter in circuit 1010 to reject broadband EMI. This is described in more detail in relation to FIGS. 11A-11D, below.

FIG. 11A illustrates a partial view of a spectrum of an interference 220 and a beacon signal 1102, overlapping the operation parameters of a receiver according to embodiments disclosed herein. FIG. 11A shows the normal operation of the receiver as well as relative magnitude of the beacon signal and a wideband EMI 220. Interference 220 may be due to a spread spectrum alien device, or a non-spread-spectrum device having amplitude 1116 (A). Beacon signal 1102, which may be generated by a desired communication partner, has amplitude 1115 (B) and bandwidth 1103.

FIG. 11B illustrates a partial view of the operation parameters of a receiver, according to embodiments disclosed herein. FIG. 11B illustrates the operation parameters of a filter 1110 and a filter 1120. Filter 1110 has a gain 1114 (G4), and a bandwidth 1104 (Bw4). In some embodiments bandwidth 1104 matches the signal channel bandwidth 200. FIG. 11B also illustrates the operation parameters of filter 1120. Filter 1120 has a gain 1113 (G3) and a bandwidth 1103 (Bw3). In some embodiments, bandwidth 1103 as a fraction of the signal channel bandwidth 200. In some embodiments, bandwidth 1103 is comparable to a beacon signal bandwidth. For example, some embodiments consistent with the present disclosure may have Bw3=C/10, where C is signal channel bandwidth 200 (cf. Table II).

Figure 11C:
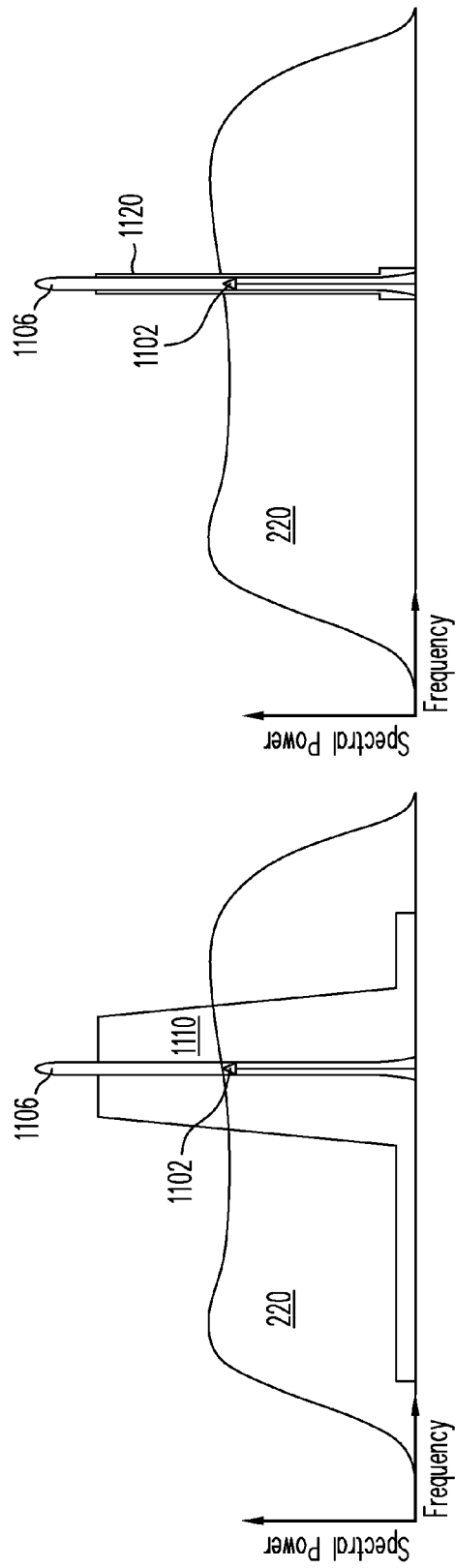
FIG. 11C illustrates a partial view of a spectrum of an EMI and a beacon signal, overlapping the operation parameters of a receiver according to embodiments disclosed herein.

FIG. 11C illustrates a partial view of the spectrum of an EMI 220 and beacon signal 1102, overlapping the operation parameters of a receiver according to embodiments disclosed herein. FIG. 11C shows the impact of EMI 220 on the use of filters 1110 and 1120, respectively. In some embodiments, passband gains 1114 and 1113 are approximately the same (i.e. G3=G4=K). Due to its broader passband, filter 1110 sees 10 times more EMI 220, compared to filter 1120.

Figure 11D:
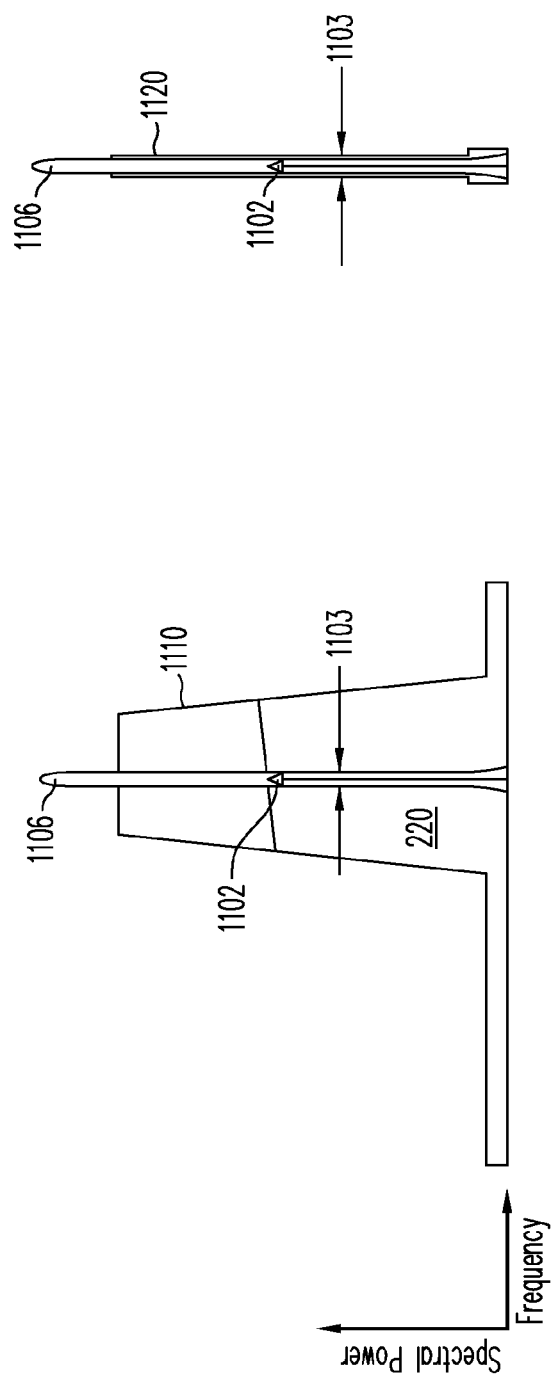
FIG. 11D illustrates a partial view of a spectrum of an EMI and a beacon signal, overlapping the operation parameters of a receiver according to embodiments disclosed herein.

FIG. 11D illustrates a partial view of a spectrum of EMI 220 and a beacon signal 1102, overlapping the operation parameters of a receiver according to embodiments disclosed herein. FIG. 11D illustrates the impact of EMI 220 on filter 1110 and on filter 1120. The response of filter 1120 to beacon signal 1102 is proportional to B·K·(C/10), where B is the amplitude 1115 of beacon signal 1102. The response of filter 1110 to beacon signal 1102 is proportional to B·K·(C/10). The response of filter 1120 to EMI 220 is proportional to A·K·(C/10), where A is the amplitude 1116 of EMI 220. The response of filter 1110 to EMI 220 is proportional to A·K·C. Thus filter 1110 sees 10 times more EMI compared to filter 1120. And filter 1110 sees approximately the same amount of beacon signal as filter 1120.

In some embodiments consistent with this disclosure, the frequency of beacon signal 1102 may be approximately 100 KHz, with a signal channel bandwidth 1104 of 3 KHz. Thus a tuned circuit with Q=33 can be used as filter 1110. Some embodiments improve EMI rejection by 100 times using a filter 1120 with bandwidth 1103 approximately equal to 30 Hz. Such a filter, centered at approximately 100 KHz may have a Q as high as about 3,300.

Some embodiments as disclosed herein provide a high Q filter using "material based resonators." These filters include resonators that realize a tuned circuit using bulk materials as piezo-crystals or surface-acoustic wave (SAW) resonators). Material based resonators generally exhibit very sharp resonances with a high Q. For example, quartz piezo-crystals in particular are inexpensively available with tight tolerances on frequency and very high Q factor. Filters are typically implemented using these devices in series resonance or parallel resonance. Filters that have high Q (typically 70,000) typically present a very narrow bandwidth. For example, some crystal resonators may have bandwidths as low as 0.5 Hz. Embodiments using this type of filters without any modification receive a beacon signal for a long time interval. The long time interval allows the notch filter to generate a sufficiently strong output. In order to reduce the time interval that a receiver is turned 'on' and increase battery life, some embodiments implement a filter circuit to embed a crystal based resonator.

Thus, embodiments consistent with the present disclosure provide a notch filter having a narrow bandwidth that is several times greater than the extremely narrow bandwidth from circuits that use crystal resonator either in series or in parallel resonance. For example, embodiments consistent with the present disclosure provide narrow band filters having a Q value greater than about 100, exceeding the performance of typical discrete LCR filters. In some embodiments, a narrow band filter as disclosed herein may provide a high Q factor without the cost of a SAW filter. Further embodiments of the present disclosure offer narrow band filters having a Q factor that is much lower than about 70,000; thus having a shorter time period for detection, increasing battery lifetime as compared to crystal resonators or crystal lattice filters. Embodiments as disclosed herein offer a solution for creating a narrow filter using relatively simple and low cost circuit components, as opposed to the 0.1% tolerances required by currently available active filters. Further, circuits having a narrow bandwidth according to embodiments disclosed herein offer a reduced size, low cost, and power efficient alternative to complex DSP circuits.

Also consistent with the present disclosure a method to realize increased bandwidth from a piezoelectric resonator is provided. The method is based on realizing a circuit transfer function by adding the conductance of piezoelectric resonator with the inverted phase conductance from a capacitor. The conductance of the piezoelectric resonator cancels the conductance of the capacitor near the parallel resonance of the crystal, resulting in a broadened resonance.

Narrow band-pass filters using piezo crystals, can be realized using a crystal bridge (or crystal lattice), which requires a specially matched set of 4 crystals, such crystal filters are not popular commodity, are expensive, and consume space. This disclosure illustrates a novel circuit that can realize a moderate Q filter by using a single, ordinary high Q crystal. In some embodiments the circuit uses an ordinary piezo resonator to create a notch filter. The notch filter has a bandwidth many times greater than the extremely narrow bandwidth of filters that use crystal series or parallel resonance. A wideband crystal filter circuit consistent with the present disclosure is described in detail below with reference to FIGS. 12A-12C.

Figure 12A:
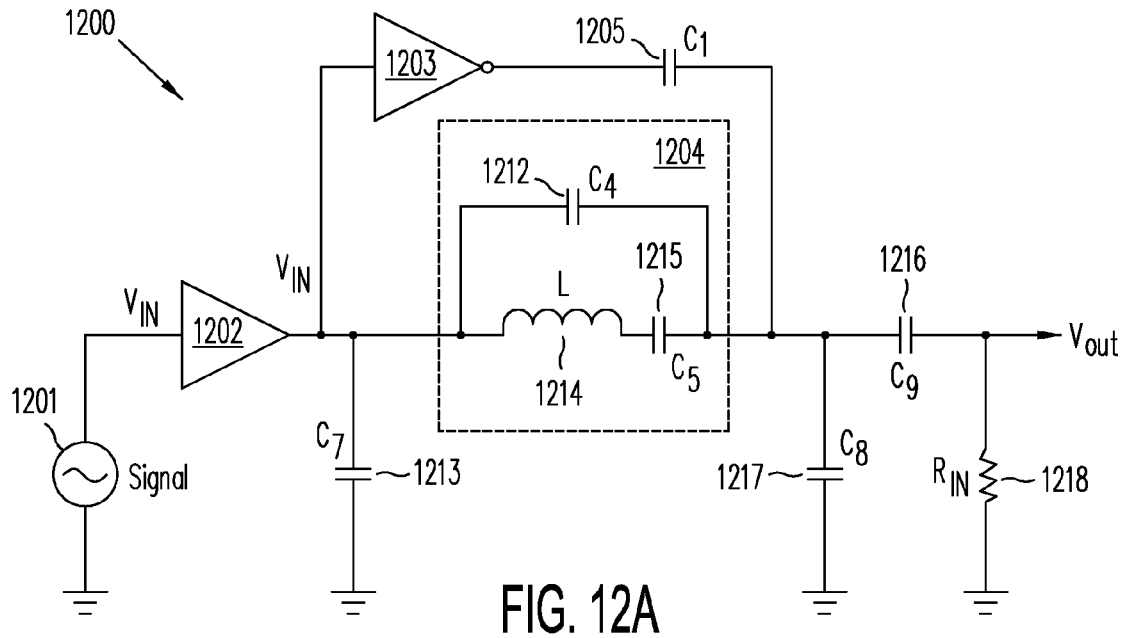
FIG. 12A illustrates a partial view of a filter circuit according to embodiments disclosed herein.

FIG. 12A illustrates a partial view of a filter circuit 1200 according to embodiments disclosed herein. Circuit 1200 comprises a signal source 1201; a buffer amplifier 1202 to buffer the signal and preferably also amplify the signal. Circuit 1200 may also include an inverting amplifier 1203 coupled to the output of buffer amplifier 1202; a crystal resonator 1204 (electrical equivalent of the crystal resonator shown in FIGS. 12A-12C). The crystal resonator 1204 is coupled to buffer amplifier 1202 on one end and the output of circuit 1200 on the other end. Filter circuit 1200 may also include a nulling capacitor 1205 (C1) coupled to the output of the inverting amplifier 1203 and the output of circuit 1200. Coupling capacitor 1216 (C9) and coupling resistor 1218 (Rin) may also be included at the output of circuit 1200. Some embodiments may further include capacitors 1213 (C7) and 1217 (C8). Crystal resonator 1204 may be represented by LC circuit as shown in FIG. 12A, having inductance 1214 (L), parallel capacitor 1212 (C4), and series capacitor 1215 (C5). According to some embodiments, C4 is a parasitic capacitance of a crystal resonator represented by circuit 1204.

According to some embodiments, the value of capacitor 1205 (C1) is chosen to cancel the current due to admittance of capacitor 1212 (C4). Typically C1=C4/Ainv; where Ainv is the inverting gain of inverter 1203. Capacitors 1213(C7) and 1217(C8) are typical parasitic capacitances to ground due to printed-circuit-board (PCB) traces and other components.

Figure 12B:
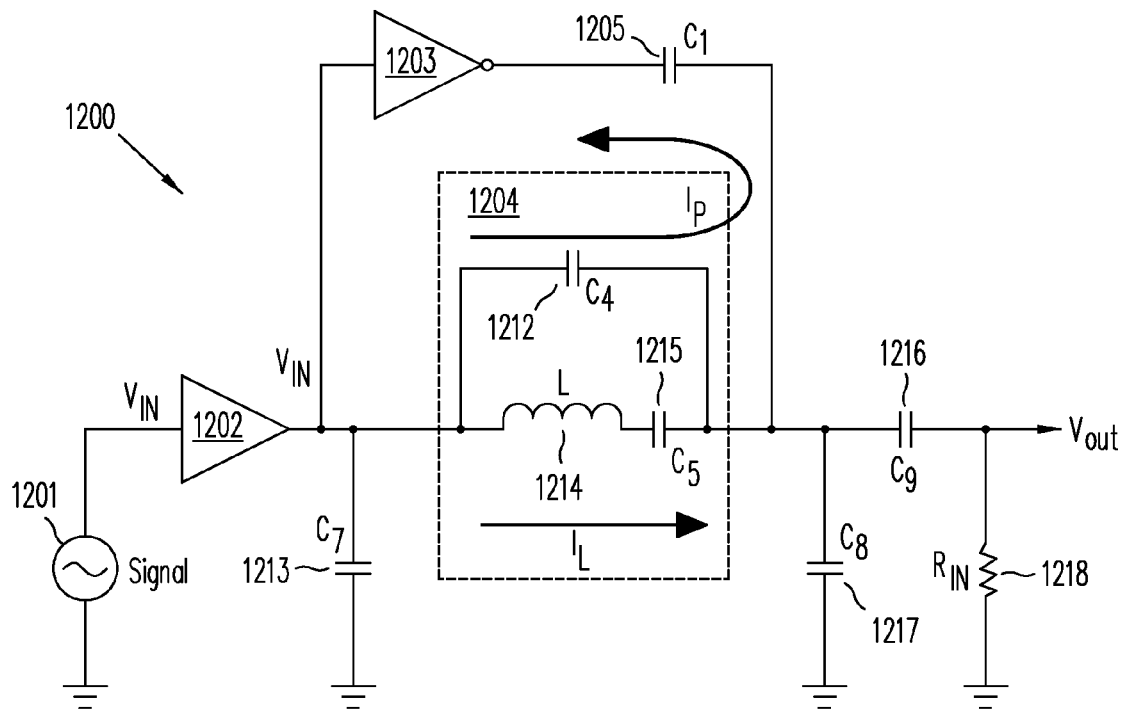
FIG. 12B illustrates a partial view of a filter circuit according to embodiments disclosed herein.

FIG. 12B illustrates a partial view of filter circuit 1200 according to embodiments disclosed herein. FIG. 12B shows currents Ip and IL produced when circuit 1200 is in operation near the series resonance frequency of crystal resonator 1204.

Figure 12C:
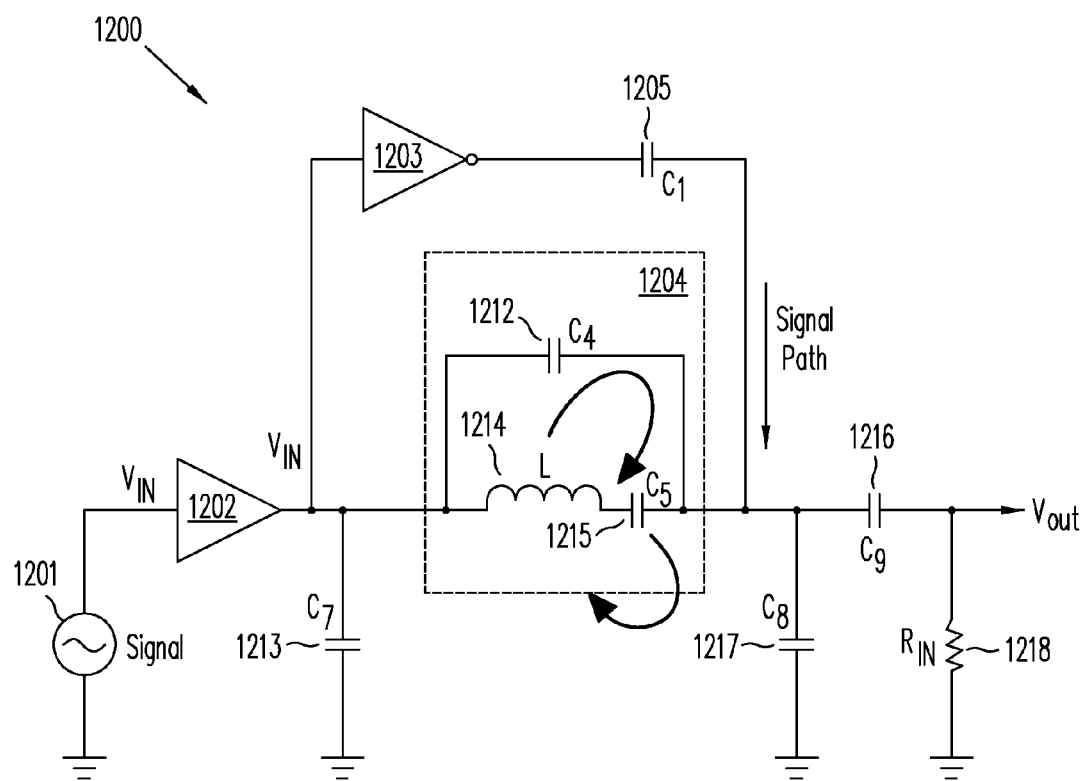
FIG. 12C illustrates a partial view of a filter circuit according to embodiments disclosed herein.

FIG. 12C illustrates a partial view of a filter circuit according to embodiments disclosed herein. FIG. 12C show the current flow in circuit 1200 near the parallel resonance frequency of crystal resonator 1204.

Figure 13:
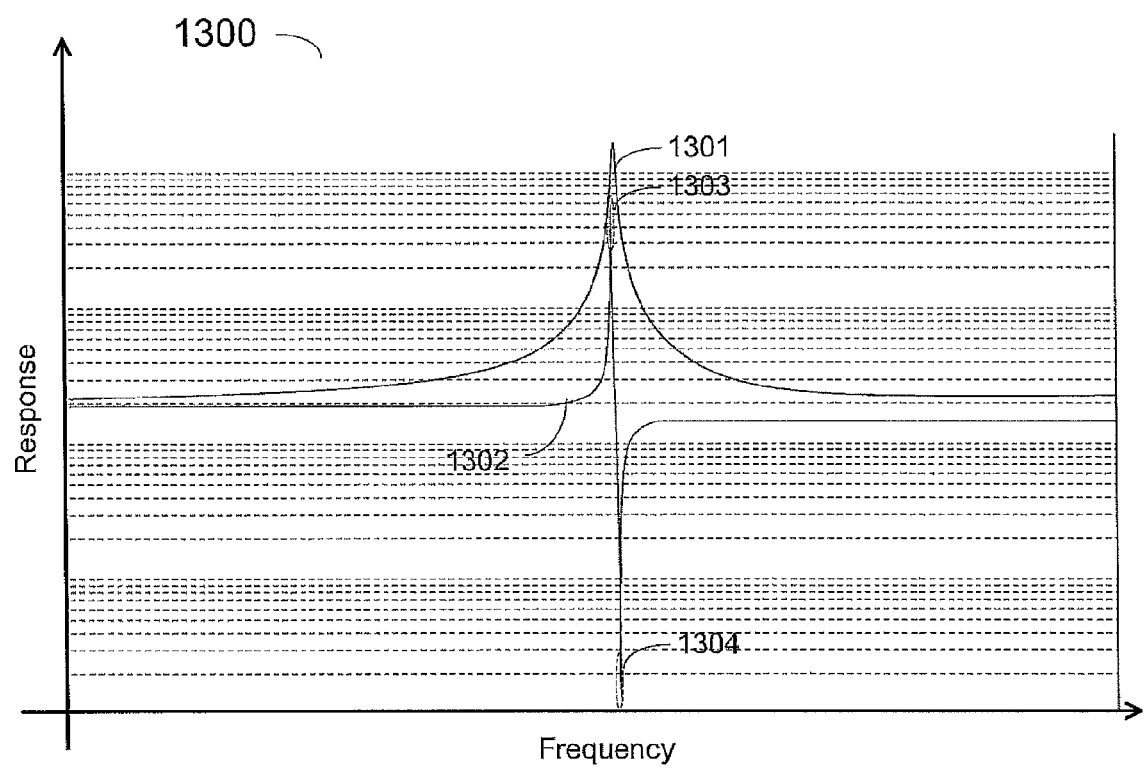
FIG. 13 illustrates a spectral response of a filter circuit according to embodiments disclosed herein.

FIG. 13 illustrates a spectral response 1300 of filter circuit 1200, according to embodiments disclosed herein. Graph 1300 illustrates frequency in the abscissas and a logarithmic value of the circuit response in the ordinates. Curve 1301 shows the response of circuit 1200 according to some embodiments of the present disclosure. In comparison, the response of a crystal filter 1302 without circuit 1200 shows extremely narrow resonances in series (1303) or in parallel (1304). FIG. 13 illustrates that circuit 1200 yields a frequency response whose bandwidth is several times greater than a crystal series or parallel resonance. In some embodiments, the resulting bandwidth of circuit 1200 may be as high as few orders of magnitude more than the crystal series or parallel bandwidth.

A crystal circuit according to embodiments disclosed herein may show an out of band attenuation higher than that of the crystal's raw series resonance or parallel resonance. Circuit 1200, using a piezo-crystal, has a high Q value with an increased bandwidth and higher gain isolation between pass vs. reject bands.

Figure 14:
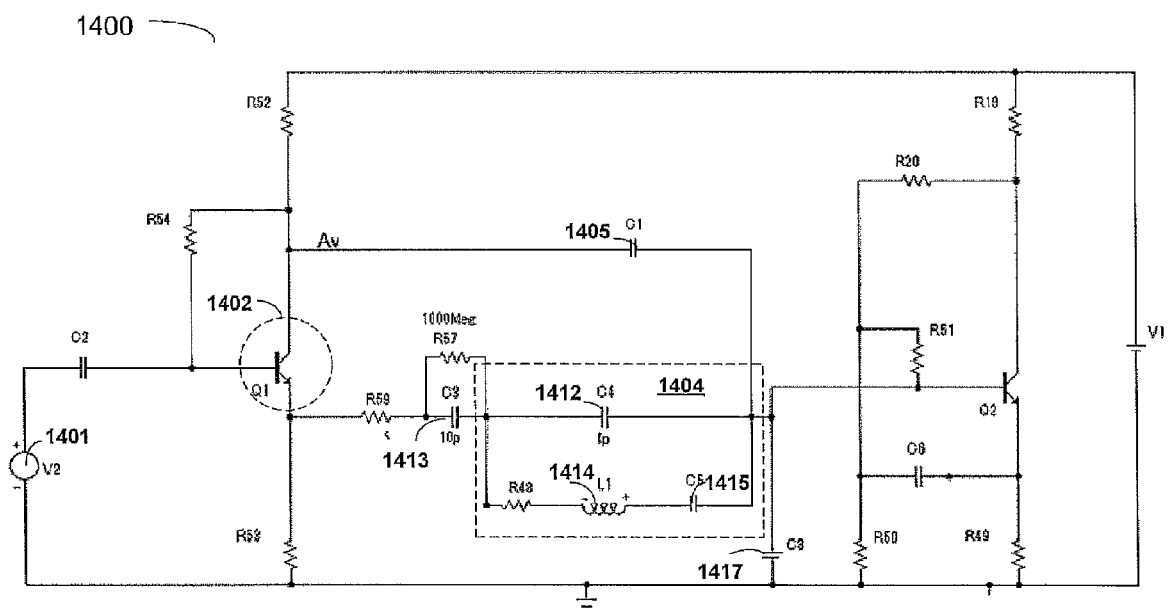
FIG. 14 illustrates a partial view of a filter circuit according to embodiments disclosed herein.

FIG. 14 illustrates a partial view of a filter circuit 1400 according to embodiments disclosed herein. Circuit 1400 includes a signal source 1401, and transistor 1402 that functions both as a buffer amplifier and an inverting amplifier. Crystal circuit 1404, which is represented by inductor 1414, a parallel capacitor 1412, and a series capacitor 1415. FIG. 14 also illustrates capacitor 1417 analogous to capacitor 1217, and capacitor 1405 analogous to capacitor 1205 (cf. FIG. 12A-12C). Circuit 1400 works in a hybrid series and parallel mode fed by non-inverting signal via capacitor 1413 (C3) and inverting signal via capacitor 1405 (C1).

Figure 15:
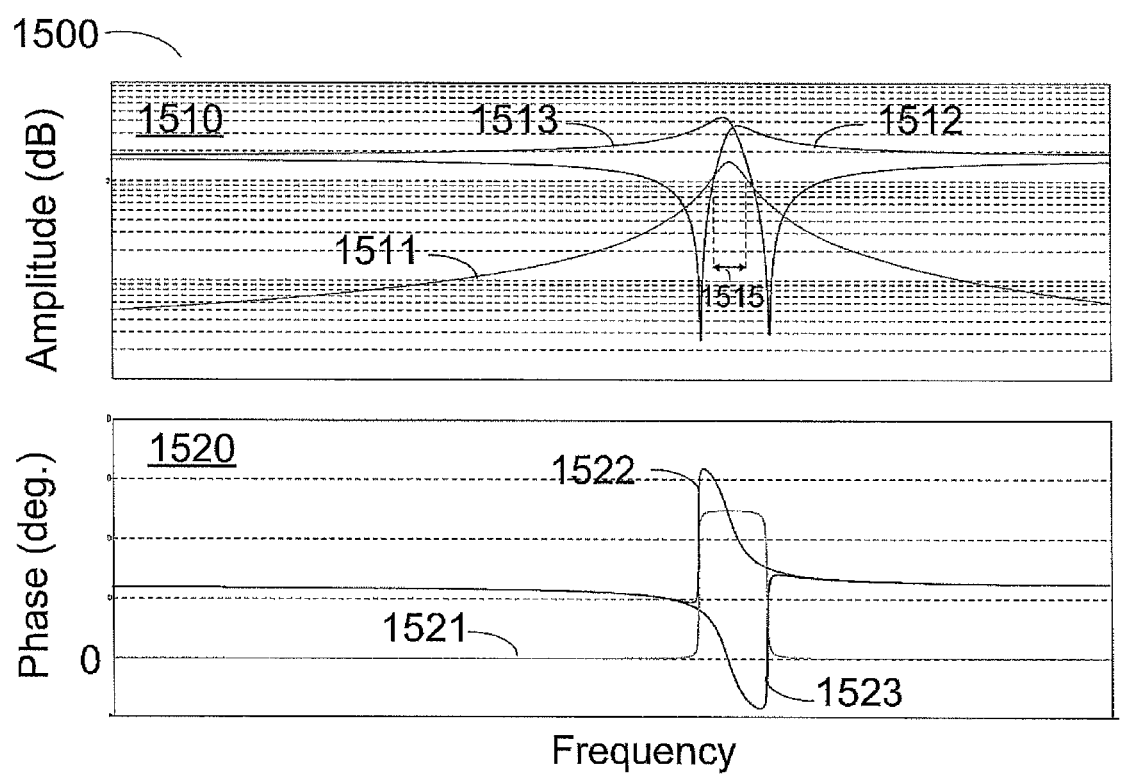
FIG. 15 illustrates a spectral response of a filter circuit according to embodiments disclosed herein.

FIG. 15 illustrates a spectral response 1500 of filter circuit 1400 according to embodiments disclosed herein. FIG. 15 illustrates the result of a simulation based on circuit 1400 shown in FIG. 14. The response graph in FIG. 15 includes an amplitude graph 1510 and a phase graph 1520. According to embodiments consistent with the present disclosure, the equivalent inductor 1414 (L) in crystal resonator (1404) is fed by the sum of currents from capacitor 1413 (C3) and capacitor 1412 (C4). The spectral response of the current from capacitor 1413 (C3) is shown as curve 1513. The spectral response of the current from capacitor 1412(C4) is shown as curve 1512. Each of curves 1512 and 1513 has a prominent current peak between the crystal's series and parallel resonance frequency.

At the crystal's series resonance frequency (cf. FIG. 12B), the admittance effect of parasitic capacitor 1212 (C4, cf. FIGS. 12B and 14) is cancelled by an opposing admittance of capacitor 1205 (C1) driven by the inverted signal produced by the inverting amplifier in transistor 1402. This results in improved out of band attenuation. Circuits 1200 and 1400 use inexpensive active parts and can usefully operate at very small current drain. Curve 1511 shows the filter pass band 1515, formed between the series and parallel resonances of crystal resonator 1404. Filter passband 1515 may be reduced by increasing the value of capacitor 1417 (C8) or decreasing the value of Rin (cf. FIG. 12A-12C). Notice the sharp dip in curves 1513 (C3) and curve 1512 (C4) corresponding to natural crystal resonances, versus wide band circuit response in curve 1511.

FIG. 15 illustrates phase graph 1520. Phase graph 1520 includes phase curve 1522 corresponding to a phase shift for the current in capacitor 1412 (C4). Phase graph 1520 also includes phase curve 1523 corresponding to a phase shift for the current in capacitor 1413 (C3). The output of circuit 1400 shows a phase shift 1521 formed by the difference between curves 1522 and 1523. The result is a phase shift that is nearly constant throughout the pass band 1515 of circuit 1400.

Figure 16:
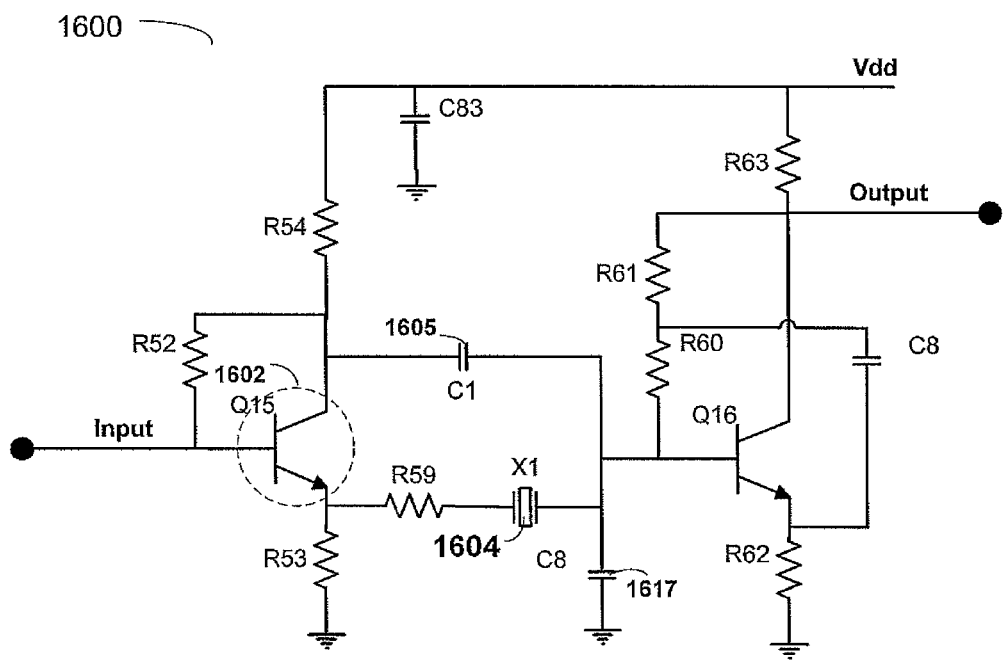
FIG. 16 illustrates a partial view of a filter circuit according to embodiments disclosed herein.

FIG. 16 illustrates a partial view of a filter circuit 1600 according to embodiments disclosed herein. A buffer and inverting amplifier 1602 can be realized from any type of amplifying elements, including but not limited to a transistor, FET, op-amp, and others. A resonating crystal 1604 could be piezo-crystal or any similar discrete, lumped or distributed resonating device. The buffer 1602 may have low output impedance resulting in a high out-of-band attenuation, according to some embodiments. In some embodiments, buffer 1602 has moderate to high output impedance. Capacitors 1605 and 1617 in circuit 1600 may be as described in detail above in relation to capacitors C1 and C8 (cf. FIGS. 12A-12C, and 14).

Figure 17:
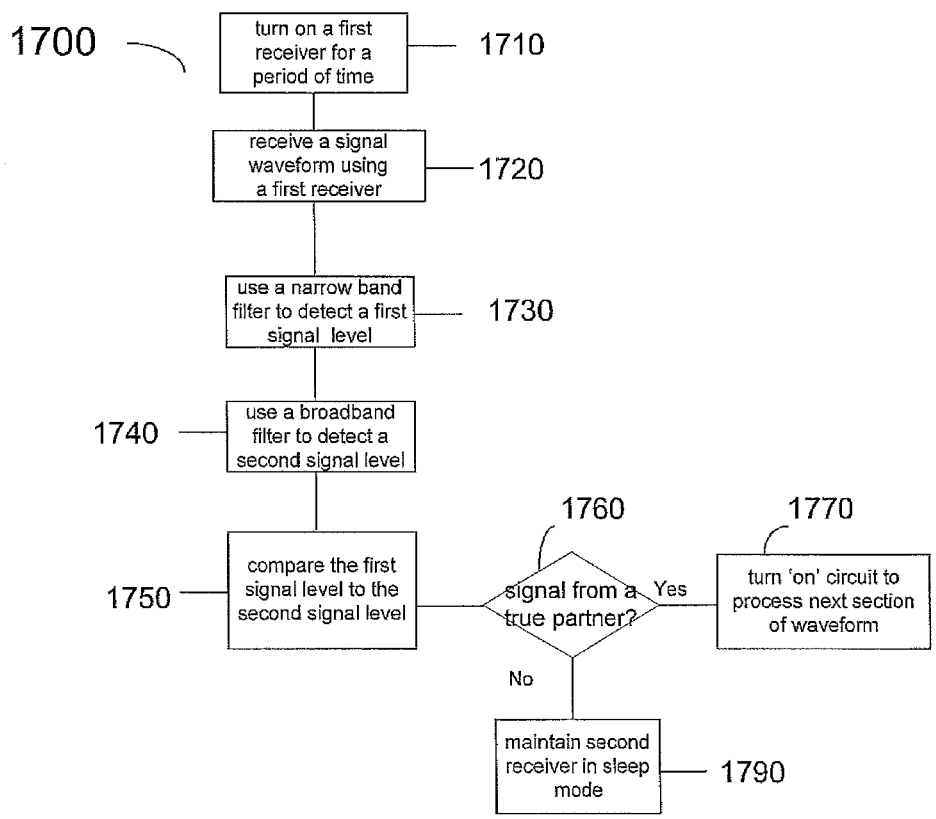
FIG. 17 illustrates a flowchart of a method to use a radio device according to embodiments disclosed herein.

FIG. 17 illustrates a flowchart of a method 1700 to use a radio device according to embodiments disclosed herein. In step 1710 a first receiver circuit is turned 'on' for a period of time. The first receiver circuit may be as a Tier 1 portion of a radio device as radio device 100 (cf. FIG. 1). In step 1720 a signal waveform is received using the first receiver. A signal waveform may be an RF signal having a waveform as waveform 610 or 650 (cf. FIGS. 6A and 6B). In step 1730 a narrow band filter is used to process the signal waveform and detect a first signal level. In step 1740 a broadband filter is used to process the signal waveform and detect a second signal level. In step 1750 the first signal level is compared to the second signal level. Step 1750 may include operations and algorithms to determine from the comparison of the first and second signal levels whether or not the signal received in step 1720 comes from a true communication partner. In step 1760 a decision is made whether or not the signal is sent by a true communication partner. If the answer to step 1760 is 'yes', then step 1770 turns 'on' a circuit to process the next section of the waveform received in step 1720. For example, the circuit turned 'on' in step 1770 may be a second receiver in the radio device. The second receiver in the radio device may be a receiver included in a Tier 2 portion of the device. A tier-2 portion of a radio device used in method 1700 may be as included in transceiver 109 (cf. FIG. 1). Step 1770 may also turn 'on' a second transmitter in a radio device as disclosed herein. The second transmitter may be as included in transceiver 109 (cf. FIG. 1). If the answer to step 1760 is 'no', then in step 1790 the second receiver is maintained in 'sleep' mode, and the first receiver is turned 'off' until a new period of time is due. The period of time during which the first receiver is turned 'on' determines a duty cycle of the radio device.

Embodiments of a radio device and methods for use consistent with the present disclosure may be implemented in a diverse range of wireless appliances and RF applications such as low power RF surveillance equipment, low power RF sensors, proximity sensors, or adaptive RF communication devices.

Embodiments of the disclosure described above are exemplary only. One skilled in the art may recognize various alternative embodiments from those specifically disclosed. Those alternative embodiments are also intended to be within the scope of this disclosure. As such, the disclosure is limited only by the following claims.

What is claimed is:

1. A radio device, comprising:
   a non-heterodyne receiver, configured to receive a signal waveform and to provide a wake-up signal to a second communication circuit when the signal waveform is a valid communication request; wherein the second communication circuit switches from a power saving state to an operating state upon receiving the wake-up signal from the non-heterodyne receiver;

the non-heterodyne receiver further comprising an Electromagnetic interference (EMI) rejection circuit including a narrow band filter and a broadband filter to reject an EMI signal.

2. The radio device of claim 1 wherein the signal waveform is a sub-carrier modulation signal.

3. The radio device of claim 1 wherein the signal waveform is a base-band modulation signal.

4. The radio device of claim 1 wherein the EMI rejection circuit includes a switch to alternate a signal measurement with the narrow band filter and a signal measurement with the broadband filter.

5. The radio device of claim 1 wherein the EMI rejection circuit is to perform a measurement with the narrow band filter concurrently with a measurement with the broadband filter.

6. The radio device of claim 1 wherein the EMI rejection circuit is configured to measure a first power of a signal with the narrow band filter and a second power of a signal with the broad band filter, wherein the first power and the second power are approximately the same when the signal is the EMI signal.

7. The radio device of claim 1 wherein the EMI rejection circuit is configured to measure a first power of a signal with the narrow band filter and a second power of a signal with the broad band filter, wherein the first power is greater than the second power when the signal is from a valid communication partner.

8. The radio device of claim 1 wherein the EMI rejection circuit is configured to measure a first power of a signal with the narrow band filter and a second power of a signal with the broadband filter, wherein the first power is approximately equal to the second power when the signal is from a valid communication partner.

9. The radio device of claim 1 wherein the EMI rejection circuit is configured to measure a first power of a signal with the narrow band filter and a second power of a signal with the broad band filter, wherein the second power is greater than the first power when the signal is the EMI signal.

10. The radio device of claim 1 wherein the EMI circuit includes a trans-conductance amplifier stage coupled to a narrow band filter and a broad band filter.

11. The radio device of claim 10 wherein the trans-conductance amplifier is a transistor and the narrow band filter is an LCR circuit.

12. The radio device of claim 1 wherein the EMI circuit includes a clipper circuit to constrain a dynamic range of the circuit, reducing signal clipping artifacts.

13. The radio device of claim 1 wherein the EMI circuit is configured to measure a first power of a signal with the narrow band filter and a second power of a signal with the broad band filter; and the EMI circuit includes a comparator circuit to compare the first power and the second power.

14. The radio device of claim 1 wherein the narrow band filter and the broadband filter are coupled to a common input for receiving, from the common input, signals to be filtered.

15. The radio device of claim 14 wherein a passband of the broadband filter includes a passband of the narrow band filter.

16. The radio device of claim 1 wherein a passband of the broadband filter includes a passband of the narrow band filter.

17. A method to operate a radio device, comprising:
turning 'on' a first receiver for a period of time;
receiving a signal waveform in the first receiver;
detecting a first signal level from the signal waveform using a narrow band filter;
detecting a second signal level from the signal waveform using a broad band filter;
comparing the first signal level and the second signal level to determine if the signal waveform is a valid communication request or an electromagnetic interference (EMI);
when the signal waveform is a valid communication request, turning 'on' a second circuit;
when the signal waveform is EMI, maintaining the second circuit in a sleep mode;
turning 'off' the first receiver after the period of time lapses.

18. The method of claim 17 wherein comparing the first signal level and the second signal level includes determining that the signal is a valid communication request when the first signal level is greater than the second signal level.

19. The method of claim 17 wherein the signal waveform is a sub-carrier modulated signal.

20. The method of claim 17 wherein the signal waveform is a base-band modulated signal.

* * * * *